United States Patent
Nozaki et al.

(10) Patent No.: US 10,459,046 B2
(45) Date of Patent: Oct. 29, 2019

(54) MAGNETIC RESONANCE IMAGING APPARATUS AND ARTIFACT SUPPRESSION METHOD THEREOF

(71) Applicant: TOSHIBA MEDICAL SYSTEMS CORPORATION, Otawara-shi (JP)

(72) Inventors: Seiji Nozaki, Otawara (JP); Satoshi Sugiura, Otawara (JP)

(73) Assignee: Canon Medical Systems Corporation, Otawara-shi (JP)

( * ) Notice: Subject to any disclaimer, the term of this patent is extended or adjusted under 35 U.S.C. 154(b) by 415 days.

(21) Appl. No.: 15/211,181

(22) Filed: Jul. 15, 2016

(65) Prior Publication Data

US 2017/0030991 A1    Feb. 2, 2017

(30) Foreign Application Priority Data

Jul. 27, 2015    (JP) .................. 2015-147563

(51) Int. Cl.
*G01R 33/565*    (2006.01)
*G01R 33/38*    (2006.01)
*G01R 33/3815*    (2006.01)

(52) U.S. Cl.
CPC ... *G01R 33/3804* (2013.01); *G01R 33/56563* (2013.01); *G01R 33/3815* (2013.01)

(58) Field of Classification Search
CPC ............. G01R 33/38; G01R 33/3804; G01R 33/3815; G01R 33/3854; G01R 33/387; G01R 33/0017; G01R 33/565; G01R 33/56563; G01R 33/4625

See application file for complete search history.

(56) References Cited

U.S. PATENT DOCUMENTS

2001/0013778 A1 * 8/2001 Tsuda ................ G01R 33/3815
 324/307
2001/0054898 A1    12/2001 Li et al.

FOREIGN PATENT DOCUMENTS

JP    2000-262490    9/2000
JP    2001-218751    8/2001
JP    2005-334101 A    12/2005

OTHER PUBLICATIONS

Japanese Office Action dated Mar. 19, 2019 in Japanese Patent Application No. 2015-147563, citing document AO therein, 4 pages.

* cited by examiner

*Primary Examiner* — Son T Le

(74) *Attorney, Agent, or Firm* — Oblon, McClelland, Maier & Neustadt, L.L.P.

(57) ABSTRACT

According to at least one of embodiments, a magnetic resonance imaging apparatus includes a superconducting magnet configured to generate a static magnetic field; a cryocooler configured to cool down the superconducting magnet in a refrigeration cycle in which mechanical fluctuation with a predetermined period is included; a sequence controller configured to acquire magnetic resonance signals for generating a diagnostic image from an object; and processing circuitry configured to correct phase fluctuation included in the magnetic resonance signals for generating a diagnostic image acquired by the sequence controller, the phase fluctuation being generated by periodic fluctuation of the static magnetic field caused by mechanical fluctuation of the cryocooler.

13 Claims, 15 Drawing Sheets

MAGNETIC RESONANCE IMAGING APPARATUS AND ARTIFACT SUPPRESSION METHOD THEREOF

CROSS-REFERENCE TO RELATED APPLICATIONS

This application is based upon and claims the benefit of priority from Japanese Patent Application No. 2015-147563 filed on Jul. 27, 2015, the entire contents of which are incorporated herein by reference.

FIELD

Embodiments described herein relate generally to a magnetic resonance imaging apparatus and an artifact suppression method of a magnetic resonance imaging apparatus.

BACKGROUND

A magnetic resonance imaging apparatus is an imaging apparatus configured to magnetically excite nuclear spin of a patient placed in a static magnetic field with an RF (Radio Frequency) pulse having the Larmor frequency and reconstruct an image based on magnetic resonance signals generated due to the excitation.

In many magnetic resonance imaging apparatuses, a superconducting magnet is used to generate a static magnetic field. In a superconducting magnet, a superconducting coil is placed in a liquid helium container and this liquid helium container is surrounded by a vacuum container called a cryostat. A magnetic resonance imaging apparatus is equipped with a helium cryocooler (hereinafter, simply referred to as a cryocooler), which is disposed on a top part of a gantry, for example. The cryocooler cools down the cryostat with a refrigeration cycle of a piston operation inside a cylinder of the cryocooler so that a superconductive state of the superconducting coil inside the liquid helium container is kept.

The piston of the cryocooler reciprocates, for example, with a period of one second, and this mechanical vibration causes periodic fluctuation in a static magnetic field. The periodic fluctuation in the static magnetic field becomes a factor of artifact such as a ghost. In order to suppress such artifact caused by mechanical fluctuation of a cryocooler, a magnetic resonance imaging apparatus further equipped with a corrective magnetic field coil for canceling the effect of periodic fluctuation in a static magnetic field is known.

However, such configuration is forced to include the corrective magnetic field coil for canceling the effect of periodic fluctuation in a static magnetic field in addition to a conventional gradient coil, which becomes a factor of increasing manufacturing cost. Further, adding the corrective magnetic field coil to an existing magnetic resonance imaging apparatus necessitates enormous amount of modification and, and thus it is not realistic.

DETAILED DESCRIPTION

Hereinafter, embodiments of the present invention will be described with reference to the accompanying drawings.

According to at least one of embodiments, a magnetic resonance imaging apparatus includes a superconducting magnet configured to generate a static magnetic field; a cryocooler configured to cool down the superconducting magnet in a refrigeration cycle in which mechanical fluctuation with a predetermined period is included; a sequence controller configured to acquire magnetic resonance signals for generating a diagnostic image from an object; and processing circuitry configured to correct phase fluctuation included in the magnetic resonance signals for generating a diagnostic image acquired by the sequence controller, the phase fluctuation being generated by periodic fluctuation of the static magnetic field caused by mechanical fluctuation of the cryocooler.

(1) Overall Configuration

Figure 1:
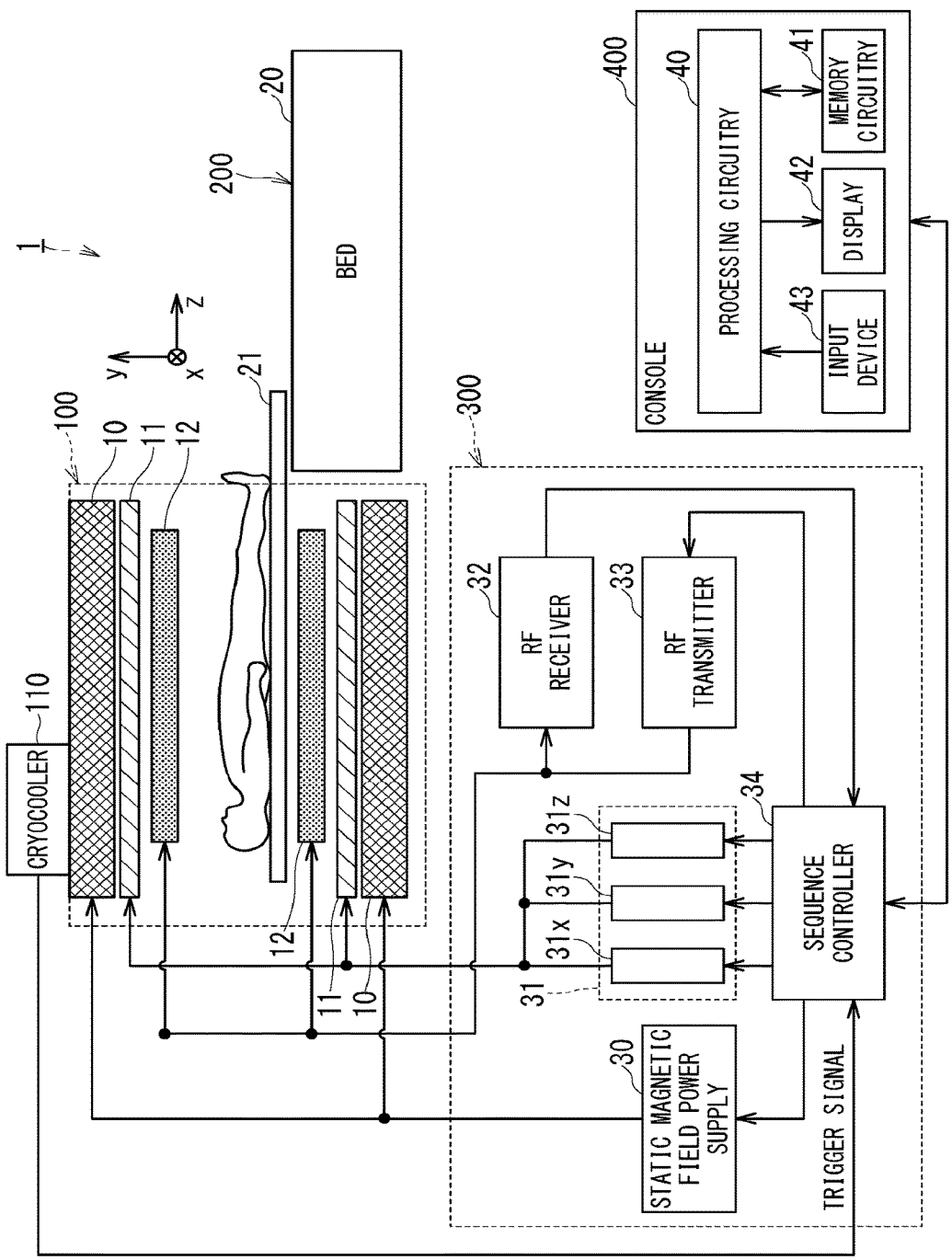
FIG. 1 is a block diagram illustrating an example of overall hardware configuration of a magnetic resonance imaging apparatus of each of the first to third embodiments.

FIG. 1 is a block diagram illustrating an example of overall hardware configuration of a magnetic resonance imaging apparatus 1 of each of the first to third embodiments. The magnetic resonance imaging apparatus 1 includes hardware components such as a gantry 100, a bed 200, a control cabinet 300, and a console 400.

The gantry 100 includes, for example, a static magnetic field magnet 10, a gradient coil 11, an RF coil 12, and these components are included in a cylindrical housing. The bed 200 includes a bed body 20 and a table 21.

The control cabinet 300 includes, for example, a static magnetic field power supply 30, three gradient coil power supplies 31 (to be exact, 31x for an X-axis, 31y for a Y-axis, and 31z for a Z-axis), an RF receiver 32, an RF transmitter 33, and a sequence controller 34. In addition, the console 400 is configured as a computer including processing circuitry 40, memory circuitry 41, an input device 43, and a display 42.

The static magnetic field magnet 10 of the gantry 100 is substantially in the form of a cylinder, and generates a static magnetic field inside the bore, i.e., the space inside the cylindrical structure of the static magnetic field magnet 10 which is an imaging region of an object (e.g., a patient). The static magnetic field magnet 10 includes a superconducting coil inside, and the superconducting coil is cooled down to an extremely low temperature by liquid helium. The static magnetic field magnet 10 generates the static magnetic field by supplying the superconducting coil with the electric current provided from the static magnetic field power supply 30 in an excitation mode. Afterward, the static magnetic field magnet 10 shifts to a permanent current mode, and the static magnetic field supply 30 is separated. Once it enters the permanent current mode, the static magnetic field magnet 10 continues to generate a strong static magnetic field for a long time, e.g., over one year.

The gradient coil 11 is also substantially in the form of a cylinder, and is fixed to the inside of the static magnetic field magnet 10. This gradient coil 11 applies gradient magnetic fields to an object in the respective directions of the X-axis, the Y-axis, and the Z-axis, by using the electric currents supplied from the gradient coil power supplies 31x, 31y, and 31z.

The bed body 20 of the bed 200 can move the table 21 in the upward and downward directions, and moves the table 21 with an object loaded thereon to a predetermined height before imaging. Afterward, at the time of imaging, the bed body 20 moves the table 21 in the horizontal direction so as to move the object inside the bore.

The RF coil 12 is also referred to as a whole body coil, is shaped approximately in the form of a cylinder so as to surround an object, and is fixed to the inside of the gradient coil 11. The RF coil 12 applies each RF pulse transmitted from the RF transmitter 33 to an object, and receives magnetic resonance signals emitted from the object due to excitation of hydrogen nuclei.

The RF transmitter 33 transmits RF pulses to the RF coil 12 based on commands inputted from the sequence controller 34.

The RF receiver 32 receives magnetic resonance signals received by the RF coil 12, and transmits raw data obtained by digitizing the received magnetic resonance signals to the sequence controller 34.

The sequence controller 34 performs a scan of the object by driving the gradient coil power supplies 31, the RF transmitter 33, and the RF receiver 32, under the control of the console 400. Then, when the sequence controller 34 receives the raw data from the RF receiver 32 by performing the scan, the sequence controller 34 transmits the raw data to the console 400. The sequence controller 34 may be configured as special-purpose hardware or include a processer which implements various types of functions by software processing.

The console 400 performs system control of the entirety of the magnetic resonance imaging apparatus 1. Specifically, the console 400 receives commands and various kinds of information such as imaging conditions inputted via a mouse and a keyboard of the input device 43 operated by a user such as an inspection examiner. Then, the processing circuitry 40 causes the sequence controller 34 to perform a scan based on the inputted imaging conditions, and reconstructs images based on the raw data transmitted from the sequence controller 34. The reconstructed images are stored as image data in the memory circuitry 41 and displayed on the display 42.

The cryocooler 110 includes a cryocooler body and a heat exchanger. The cryocooler body is also referred to as a cold head, and is mounted on the upper part of the gantry 100. A cylinder is included in the cryocooler body. Helium gas supplied to the inside of the cylinder via the heat exchanger is periodically compressed and expanded by mechanical motion of piston structure in the cylinder. One cycle of the compression and expansion corresponds to a refrigeration cycle, and the superconductive state of the superconducting coil inside the liquid helium container is kept by repeating this refrigeration cycle.

The cryocooler 110 is configured to output a trigger signal in synchronization with a period of the refrigeration cycle. This trigger signal is outputted to the sequence controller 34. The sequence controller 34 further transmits the received trigger signal to the console 400.

As described above, the static magnetic field magnet 10 is configured to continue to generate a strong magnetic field over a long time, once it enters the permanent current mode. Thus, even if the entirety of the magnetic resonance imaging apparatus 1 except the cryocooler 110 is powered off in each non-operational period such as nighttime, the cryocooler 110 continues to operate.

The period of the refrigeration cycle, i.e., the operation period of the piston of the cryocooler 110 depends on a power-supply frequency of the power supply, which is supplied to the cryocooler 110, and the period of the refrigeration cycle is, for example, approximately one second. In general, a power-supply frequency is stable, and thus the refrigeration cycle is also stable.

Since the cryocooler 110 is fixed to the gantry 100, the periodic mechanical fluctuation due to the piston motion propagates to the superconducting magnet 10. As a result, static-magnetic-field fluctuation in conjunction with the refrigeration cycle occurs.

Hereinafter, each embodiment for suppressing the static-magnetic-field fluctuation will be described.

First Embodiment

Figure 2:
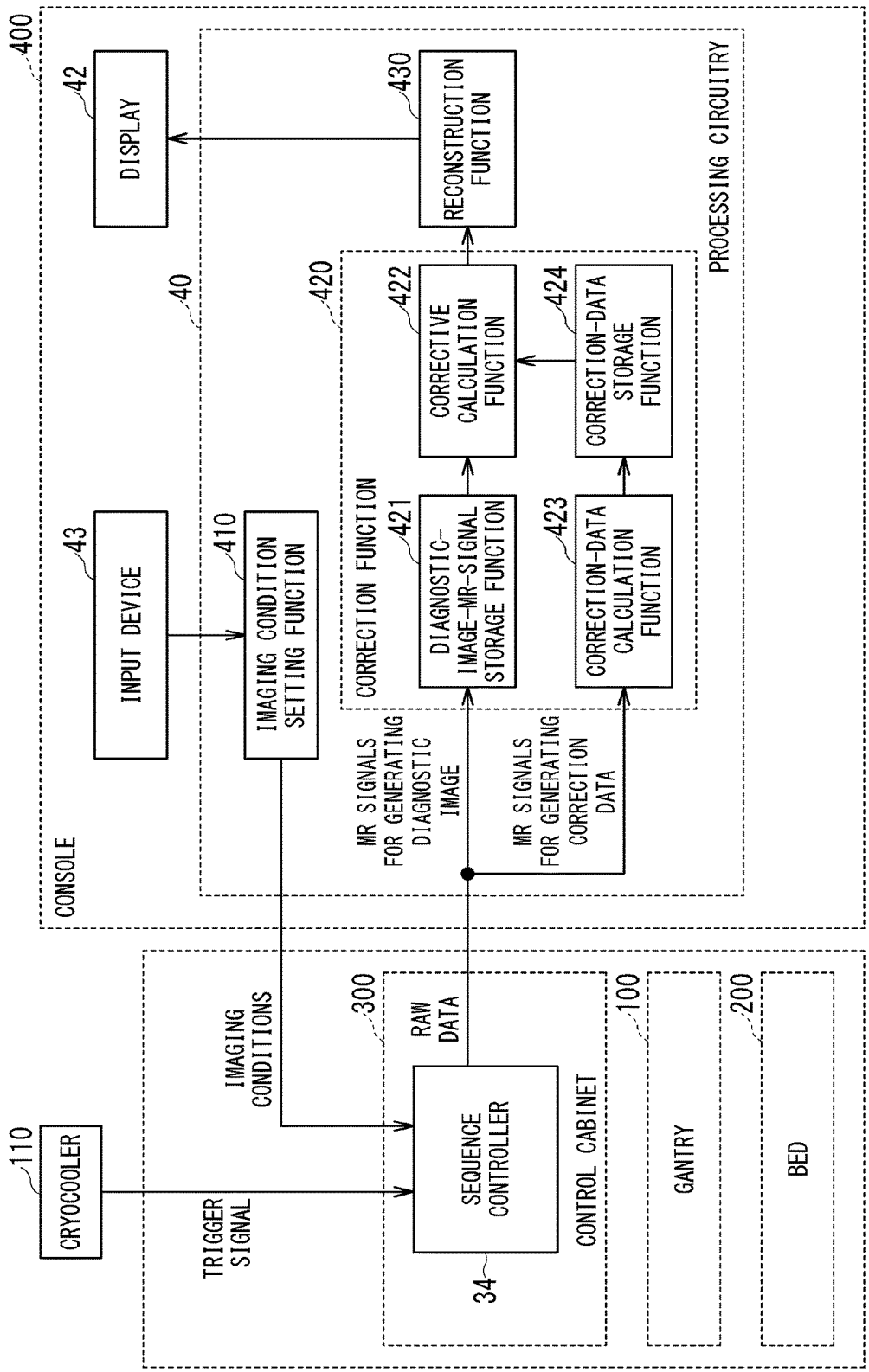
FIG. 2 is a functional block diagram illustrating an example of configuration relevant to suppression of static-magnetic-field fluctuation in the magnetic resonance imaging apparatus of the first embodiment.

FIG. 2 is a functional block diagram illustrating an example of configuration relevant to suppression of the static-magnetic-field fluctuation in the magnetic resonance imaging apparatus 1 of the first embodiment. As shown in FIG. 2, the console 400 of the magnetic resonance imaging apparatus 1 includes the display 42, the input device 43, and the processing circuitry 40.

The processing circuitry 40 may be configured as special-purpose hardware or include a processer which implements various types of functions by software processing. Hereinafter, an example in which the processing circuitry 40 implements various types of functions by software processing of the processor will be described. Specifically, as shown in FIG. 2, the processing circuitry 40 implements an imaging condition setting function 410, the correction function 420, and a reconstruction function 430 by executing programs stored in the memory circuitry 41 or programs directly stored in the processor of the processing circuitry 40. In addition, the processing circuitry 40 implements a diagnostic-image-MR-signal storage function 421, a corrective calculation function 422, a correction data calculation function 423, and a correction data storage function 424 which are included in the correction function 420.

The above-described term "processor" means, for instance, a circuit such as a CPU (Central Processing Unit), a GPU (Graphics Processing Unit), an ASIC (Application Specific Integrated Circuit), a programmable logic device including an SPLD (Simple Programmable Logic Device) and a CPLD (Complex Programmable Logic Device) as examples, and an FPGA (Field Programmable Gate Array). The number of processors included in the processing circuitry 60 may be one, two, or more.

The imaging condition setting function 410 in FIG. 2 sets various imaging conditions such as a pulse sequence, resolution, and imaging positions to the sequence controller 34, based on information inputted by a user via the input device 43. A first pulse sequence for acquiring correction data and a second pulse sequence for acquiring a diagnostic image are performed in each of the embodiments described below, and these pulse sequences are also set to the sequence controller 34 by the imaging condition setting function 410.

The sequence controller 34 acquires magnetic resonance signals (hereinafter, referred to as MR signals) for generating correction data and MR signals for generating a diagnostic image in synchronization with the trigger signal outputted from the cryocooler 110. The acquired MR signals for generating the correction data and the MR signals for generating a diagnostic image are transmitted to the correction function 420 of the processing circuitry 40.

The correction data calculation function 423 of the correction function 420 calculates phase fluctuation or magnetic-resonance-frequency fluctuation as correction data from the MR signals for generating the correction data, and the calculated correction data are stored in the memory circuitry 41 by the correction data storage function 424. The phase fluctuation and/or magnetic-resonance-frequency fluctuation, which are calculated as the correction data, is caused by the periodic fluctuation in the static magnetic field in association with the mechanical fluctuation of the cryocooler 110.

Incidentally, the MR signals for generating the correction data may be acquired before acquisition of the MR signals for generating a diagnostic image. For example, the MR signals for generating the correction data are acquired during installation work of the magnetic resonance imaging apparatus 1 and/or at the time of startup of the magnetic resonance imaging apparatus 1. Additionally or alternatively, when acquisition of the MR signals for generating a diagnostic image is defined as a main scan, acquisition of the MR signals for generating the correction data may be performed as a prescan prior to the main scan each time of performing the main scan. In addition, the MR signals for generating the correction data is not necessarily required to be acquired from a human body (i.e., a patient) but may be acquired from a phantom.

The diagnostic-image-MR-signal storage function 421 of the correction function 420 temporarily stores the MR signals for acquiring a diagnostic image acquired in imaging (i.e., the main scan) in the memory circuitry 41, and transmits the MR signals for generating a diagnostic image to the corrective calculation function 422. Each of the MR signals for generating a diagnostic image includes phase fluctuation caused by the periodic fluctuation in the static magnetic field in association with the mechanical fluctuation of the cryocooler 110. The corrective calculation function 422 corrects the phase fluctuation included in the MR signals for generating a diagnostic image by using the correction data stored in the memory circuitry 41. The MR signals for generating a diagnostic image corrected by the correction function 420 are subjected to reconstruction processing such as inverse Fourier transform, and thereby a diagnostic image is generated. The generated diagnostic image is displayed on the display 42.

Before describing details of processing performed by the correction function 420, generation mechanism of phase fluctuation caused by the mechanical fluctuation of the cryocooler 110 and artifact caused by this phase fluctuation will be described by reference to FIG. 3 and FIG. 4.

Figure 3:
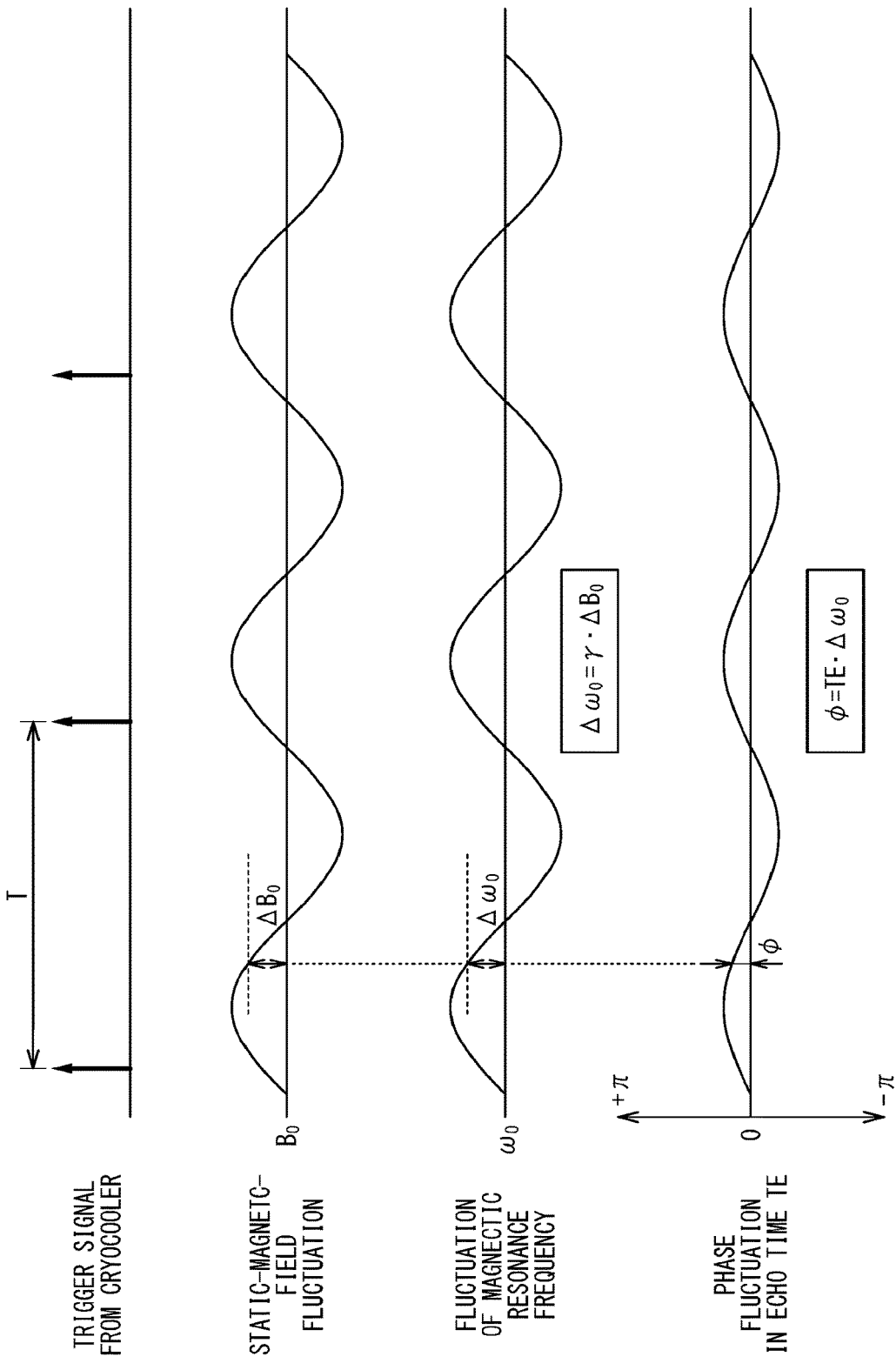
FIG. 3 is a schematic timing chart illustrating generation mechanism of phase fluctuation caused by mechanical fluctuation of a cryocooler.

The top part of FIG. 3 is a timing chart illustrating each trigger signal which is outputted from the cryocooler 110. The period of the trigger signal corresponds to the period T of the refrigeration cycle of the cryocooler 110. As described above, the period T of the refrigeration cycle is approximately one second.

The second top part of FIG. 3 is a timing chart illustrating sinusoidal fluctuation in the static magnetic field caused by the mechanical fluctuation of the cryocooler 110 which fluctuates with the period T of the refrigeration cycle. A fluctuation waveform of a static magnetic field does not necessarily become like a sine wave. However, as long as fluctuation waveform of a static magnetic field shows periodicity, the magnetic resonance imaging apparatus 1 of the present embodiment can suppress artifact caused by the static-magnetic-field fluctuation.

The third top part of FIG. 3 is a timing chart illustrating fluctuation in a magnetic resonance frequency caused by the static-magnetic-field fluctuation. Here, a magnetic resonance angular frequency without the static-magnetic-field fluctuation is defined as $\omega_0$, and fluctuation of the static magnetic field is defined as $\Delta B_0$. Then, the fluctuation $\Delta\omega_0$ of the magnetic resonance angular frequency, which indicates deviation from $\omega_0$, can be expressed by the following formula (1).

$$\Delta\omega_0 = \gamma * \Delta B_0 \qquad \text{Formula (1)}$$

In the formula (1), $\gamma$ indicates a constant called a gyromagnetic ratio.

The bottom part of FIG. 3 is a timing chart illustrating the phase fluctuation $\varphi$ caused when the magnetic resonance angular frequency fluctuates by the fluctuation of $\Delta\omega_0$. When the time length from application timing of an excitation pulse to the center timing of sampling of an MR signal (i.e., echo signal), i.e., an echo time, is defined as TE, the phase fluctuation $\varphi$ can be given by the following formula (2).

$$\varphi = TE * \Delta\omega_0 \qquad \text{Formula (2)}$$

Figure 4:
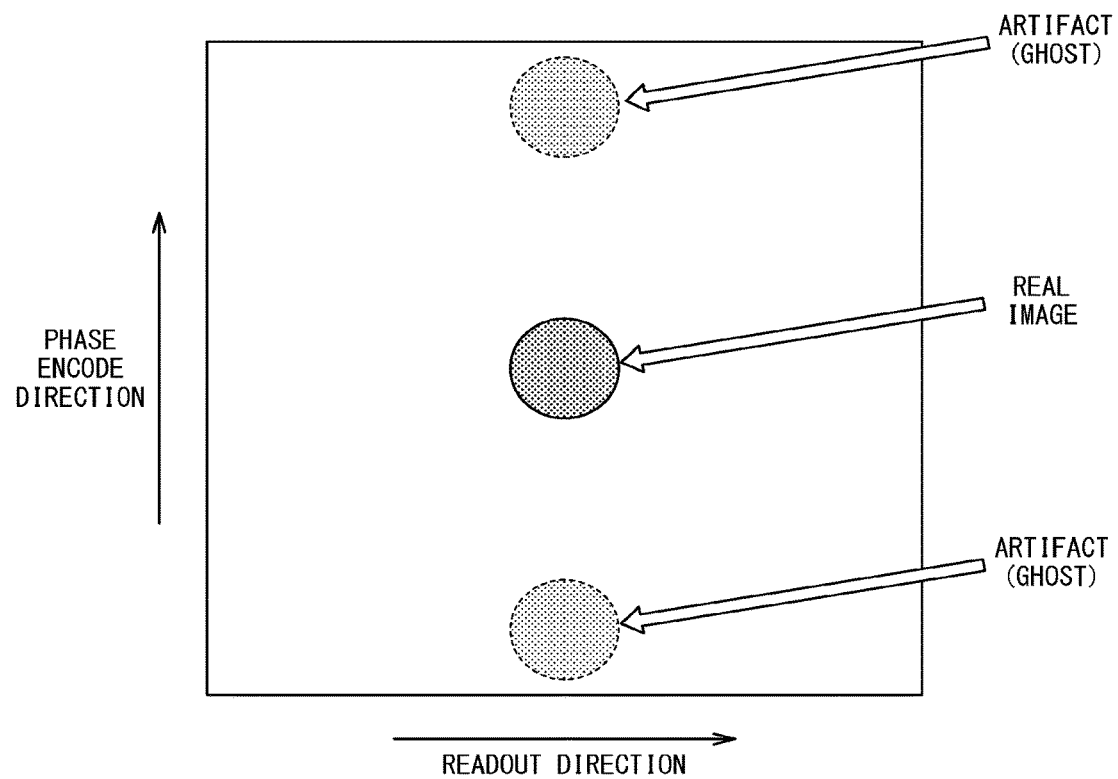
FIG. 4 is a schematic diagram illustrating an example of artifact caused by phase fluctuation.

FIG. 4 is a schematic diagram illustrating an example of artifact caused when the above-describe phase fluctuation p occurs. The deep-colored circular image at the center of FIG. 4 indicates the real image, whereas the two light-colored circular images above and below the real image in FIG. 4 each indicate artifacts. As is clear from the bottom part of FIG. 3, the period of the phase fluctuation $\varphi$ is the same as the fluctuation period of the cryocooler 110 and is, for example, approximately one second. Since an acquiring period for acquiring data of one line in the readout direction is sufficiently smaller than the period of the phase fluctuation, the phase fluctuation between respective acquiring periods for acquiring data in the readout direction is small. Thus, a ghost (i.e., artifact) in the readout direction hardly occurs.

By contrast, an acquiring period for acquiring data in the phase encode direction may become longer than the period of the phase fluctuation (e.g., one second) in many cases. In those cases, plural periods of the phase fluctuation are included in each acquiring period for acquiring data in the phase encode direction. Accordingly, data of respective lines in the phase encode direction are acquired under the conditions in which the static magnetic field which are different between respective lines in the phase encode direction. As a result, signal intensity of an MR signal in the phase encode direction is subjected to modulation due to the fluctuation in the static magnetic field, and thus a ghost (i.e., artifact) of the real image is generated in the phase encode direction.

Hereinafter, methods of suppressing such artifact will be described in detail. As described above, the method of suppressing artifact in the first embodiment can divided into two phases including the first phase of acquiring the MR signals for generating the correction data to calculate the correction data, and the second phase of correcting the MR signals for generating a diagnostic image by using the calculated correction data.

Figure 5:
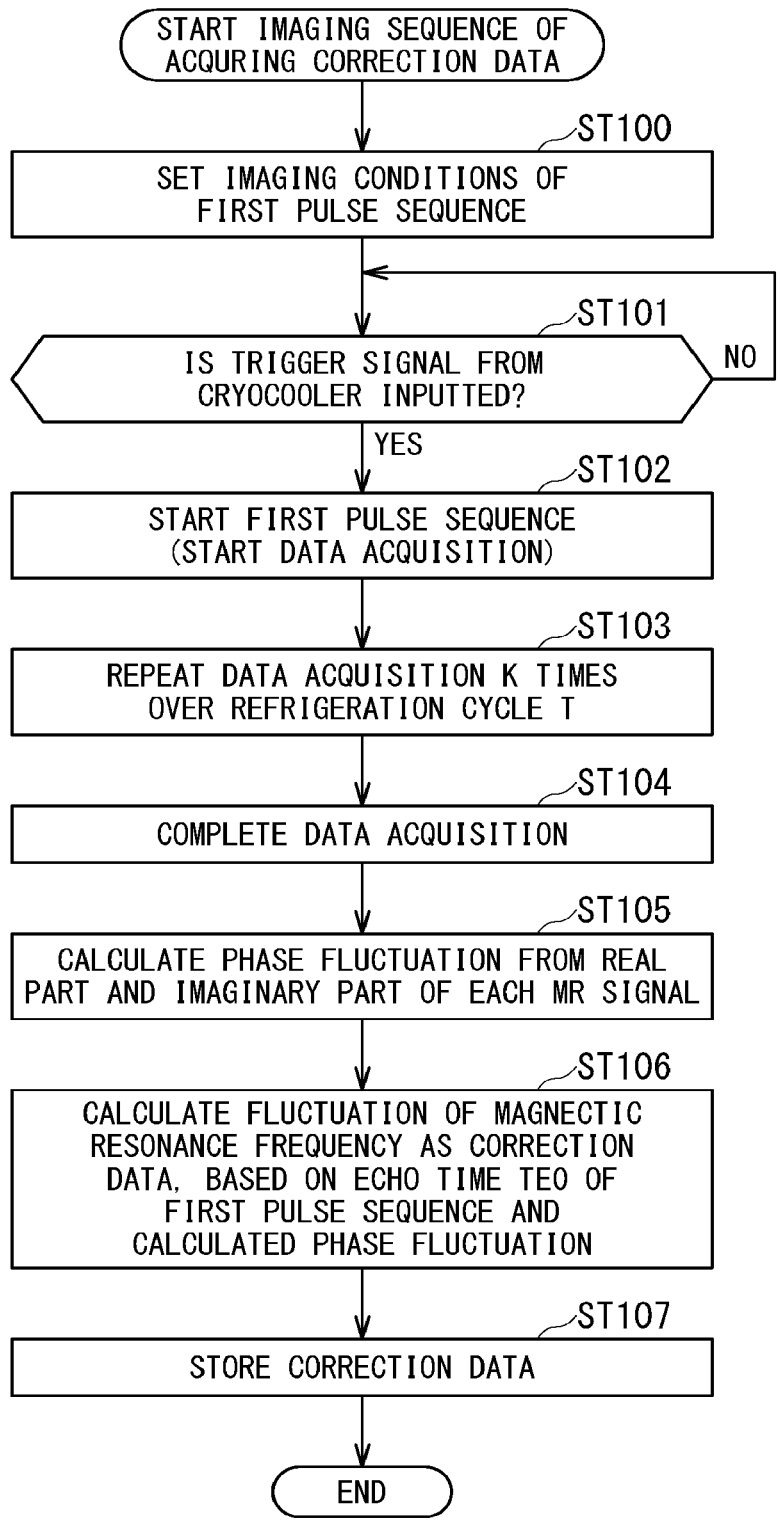
FIG. 5 is a flowchart illustrating an example of processing in which MR signals for generating correction data are acquired and the correction data are calculated.

FIG. 5 is a flowchart illustrating an example of processing of the first phase.

First, in the step ST100 of FIG. 5, the imaging condition setting function 410 of the processing circuitry 40 sets imaging conditions for acquiring the MR signals for generating the correction data. The pulse sequence included in the imaging conditions set in the step ST100 is defined as the first pulse sequence.

In the step ST101, the sequence controller 34 waits until the timing when a trigger signal from the cryocooler 110 is inputted.

In the step ST102, when the trigger signal is inputted, the sequence controller 34 causes respective components of the magnetic resonance imaging apparatus 1 to start the first pulse sequence in synchronization with the trigger signal so as to start data acquisition of the MR signals for generating the correction data.

This data acquisition is repeated, for example, K times over the period T of the refrigeration cycle in the step ST103.

When K times of data acquisition are completed, data acquisition in the step ST104 is completed.

Figure 6:
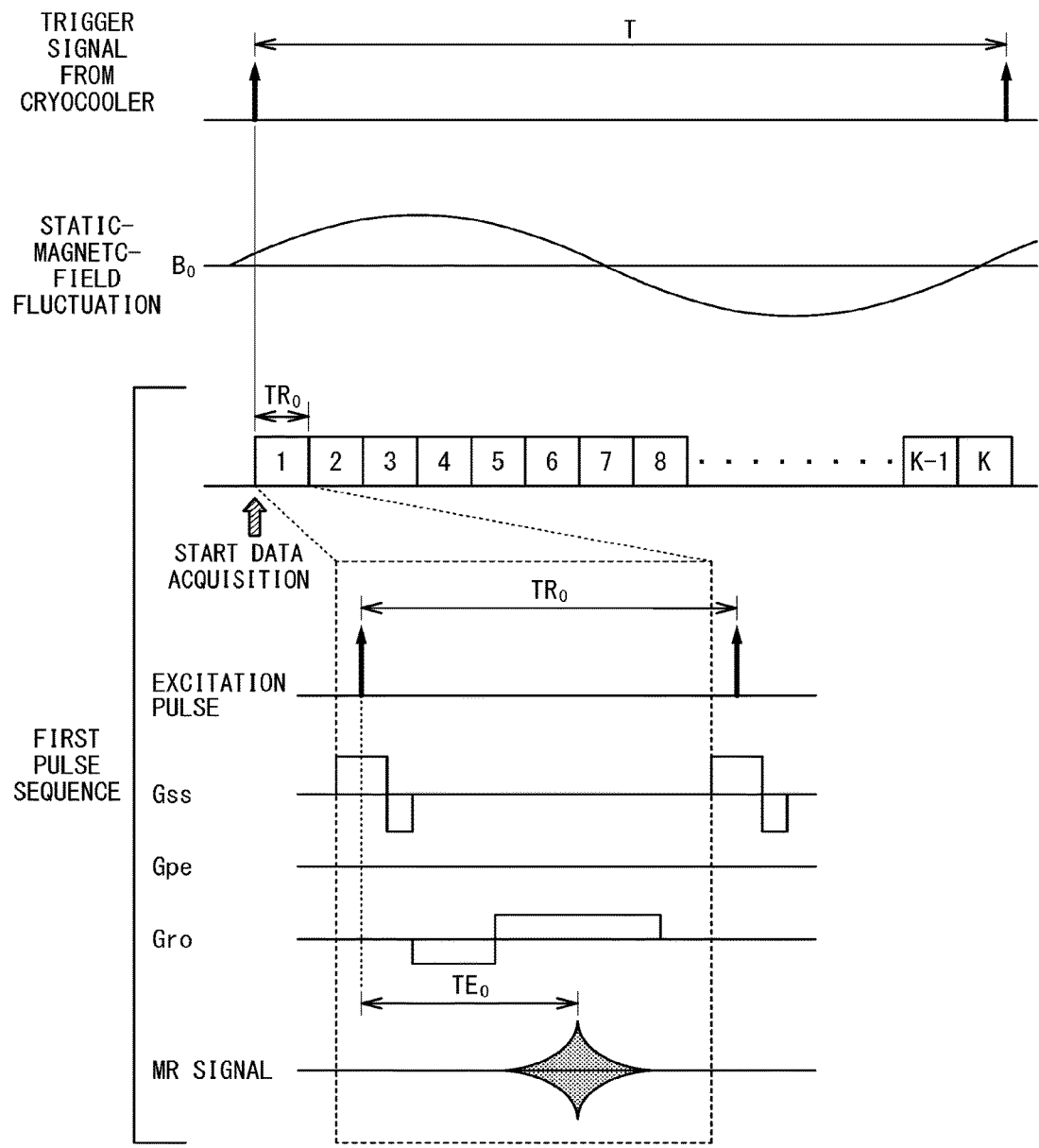
FIG. 6 is a schematic timing chart illustrating an example of processing in which MR signals for generating the correction data are acquired.

FIG. 6 is a schematic timing chart illustrating the processing of the above-described steps ST101 to ST104.

The top part of FIG. 6 illustrates each trigger signal of period T outputted from the cryocooler 110. The period T of the trigger signal corresponds to the period T of the refrigeration cycle of the cryocooler 110.

The second top part of FIG. 6 illustrates the static-magnetic-field fluctuation caused by the mechanical fluctuation of the cryocooler 110, and the fluctuation period of the static magnetic field matches the period T of the trigger signal.

The third top part of FIG. 6 indicates that data acquisition by the first pulse sequence is repeated K times from the first acquisition to K-th acquisition over the period T of the refrigeration cycle. The lower half of FIG. 6 illustrates an example of the first pulse sequence used for one line of data acquisition. In the lower half of FIG. 6, respective timing charts of an excitation pulse, a slice selection gradient Gss, a phase encode gradient Gpe, a readout gradient Gro, and an MR signal (i.e., an echo signal) are indicated from top to bottom. Although the first pulse sequence illustrated in FIG. 6 indicates a pulse sequence according to a gradient echo method (hereinafter, referred to as a GRE method), the pulse sequence of the first pulse sequence is not limited to a pulse sequence according to the GRE method but another type of pulse sequence may be used. For example, a spin echo method (hereinafter, referred to as an SE method) may be used for the first pulse sequence.

Note that a GRE method is more susceptible to the influence of the static-magnetic-field fluctuation than an SE method. This holds true for imaging of generating a diagnostic image (i.e., the main scan). For this reason, an example in which pulse sequences according to the GRE method are used for both of the first pulse sequence of acquiring the MR signals for generating the correction data and the second pulse sequence of acquiring the MR signals for generating a diagnostic image will be described below.

As the first pulse sequence of GRE method, the interval of excitation pulses, i.e., the repetition time is set as $TR_0$ as shown in the lower half of FIG. 6. In addition, the echo time from the application timing to the center timing of the echo is set as $TE_0$. Then, the sequence block surrounded by the broken-line frame in the lower half of FIG. 6 is repeated K times from the first block to the K-th block, and thereby K MR signals are acquired.

Note that the static-magnetic-field fluctuation caused by the mechanical fluctuation of the cryocooler 110 is considered to have little spatial dependence, and thus the phase encode amount is set to zero (i.e., Gpe is set to zero) in any of the first block to the Kth block in the first pulse sequence for acquiring the correction data.

Returning to FIG. 5, in the step ST105, the phase fluctuation is calculated based on the real part and the imaginary part of each of the acquired K MR signals. when the value of the real part at the sampling center of the i-th (i=1 to K) MR signal is defined as Real(i) and the value of the imaginary part at the sampling center of the i-th MR signal is defined as Img(i), the i-th phase fluctuation $\varphi(i)$ is calculated by the following formula (3).

$$\varphi(i)=\tan^{-1}[\text{Img}(i)/\text{Real}(i)](i=1 \text{ to } K) \quad \text{Formula (3)}$$

The relationship indicated by the formula (2) holds between phase fluctuation amount, a magnetic resonance angular frequency, and an echo time.

In the step ST106, the i-th magnetic-resonance-frequency fluctuation $\Delta f_0(i)$ is calculated by using the following formula (4) on the basis of the phase fluctuation $\varphi(i)$ calculated by the formula (3) and the echo time $TE_0$ in the first pulse sequence.

$$\Delta f_0(i)=[\varphi(i)/TE_0]/(2\pi)(i=1 \text{ to } K) \quad \text{Formula (4)}$$

Here, it is assumed that the echo time $TE_0$ is sufficiently smaller than the period T of the refrigeration cycle and static-magnetic-field fluctuation within an echo time $TE_0$ is negligible.

In the step ST107, the correction data storage function 424 stores the calculated magnetic-resonance-frequency fluctuation $\Delta f_0(i)$ (i=1 to K) as the correction data in the memory circuitry 41. Incidentally, the phase fluctuation $\varphi(i)$ (i=1 to K) calculated by the formula (3) may be stored as the correction data instead of the magnetic-resonance-frequency fluctuation $\Delta f_0(i)$ or in addition to the magnetic-resonance-frequency fluctuation $\Delta f_0(i)$.

Figure 7:
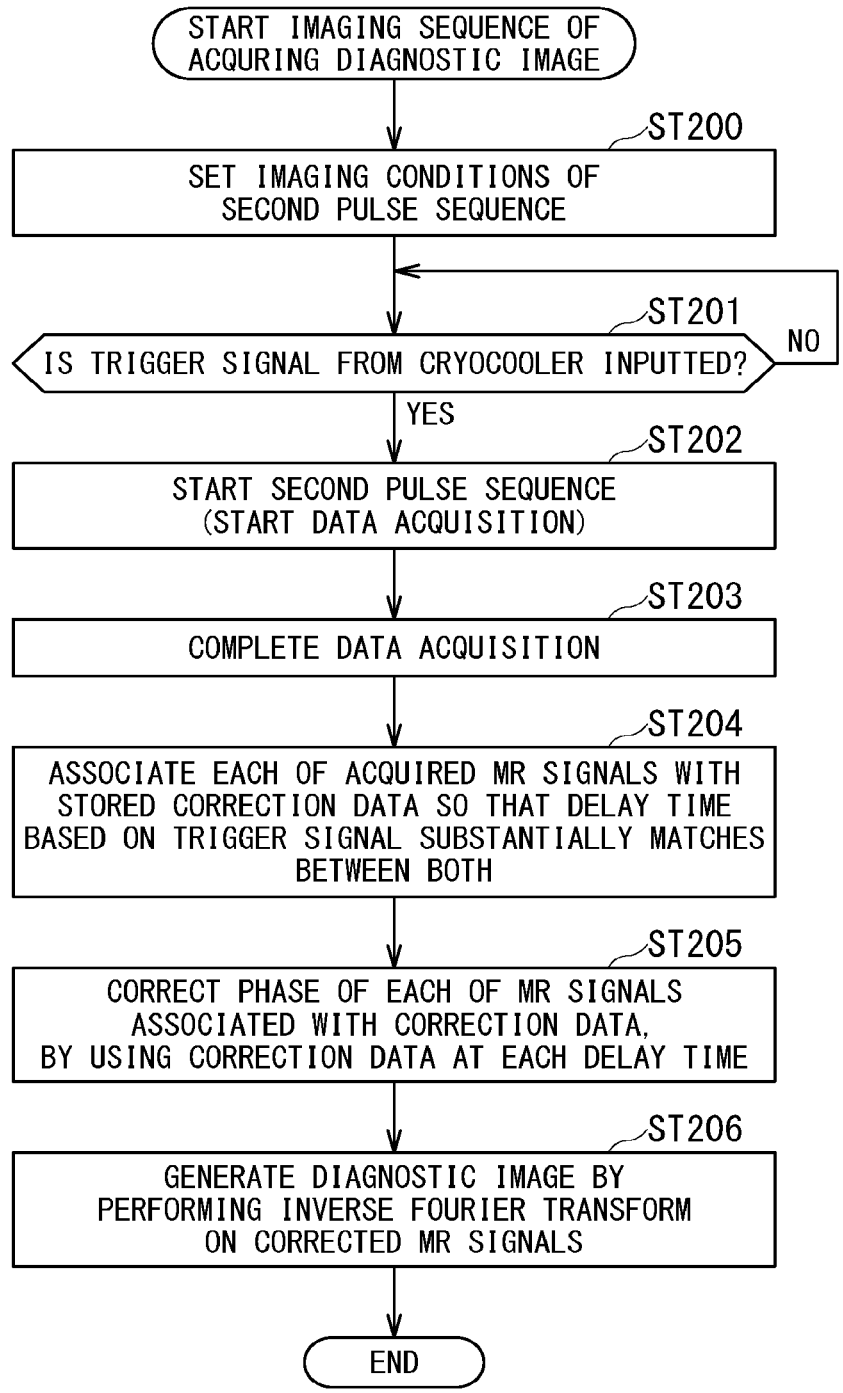
FIG. 7 is a flowchart illustrating an example of processing in which the MR signals for generating a diagnostic image are corrected by using the calculated correction data.

FIG. 7 is a flowchart illustrating an example of processing of the second phase in which the MR signals for generating a diagnostic image are corrected by using the calculated correction data. The second phase is imaging performed as a so-called main scan in order to acquire a diagnostic image of a patient.

In the step ST200 of FIG. 7, the imaging condition setting function 410 of the processing circuitry 40 sets imaging conditions for acquiring the MR signals for generating a diagnostic image. The pulse sequence included in the imaging conditions set in the step ST200 is defined as the second pulse sequence.

In the step ST201, the sequence controller 34 waits until the timing when the trigger signal from the cryocooler 110 is inputted.

In the step ST202, when the trigger signal is inputted, the sequence controller 34 causes respective components of the magnetic resonance apparatus 1 to start the second pulse sequence in synchronization with the trigger signal so as to acquire the MR signals for generating a diagnostic image.

Figure 8:
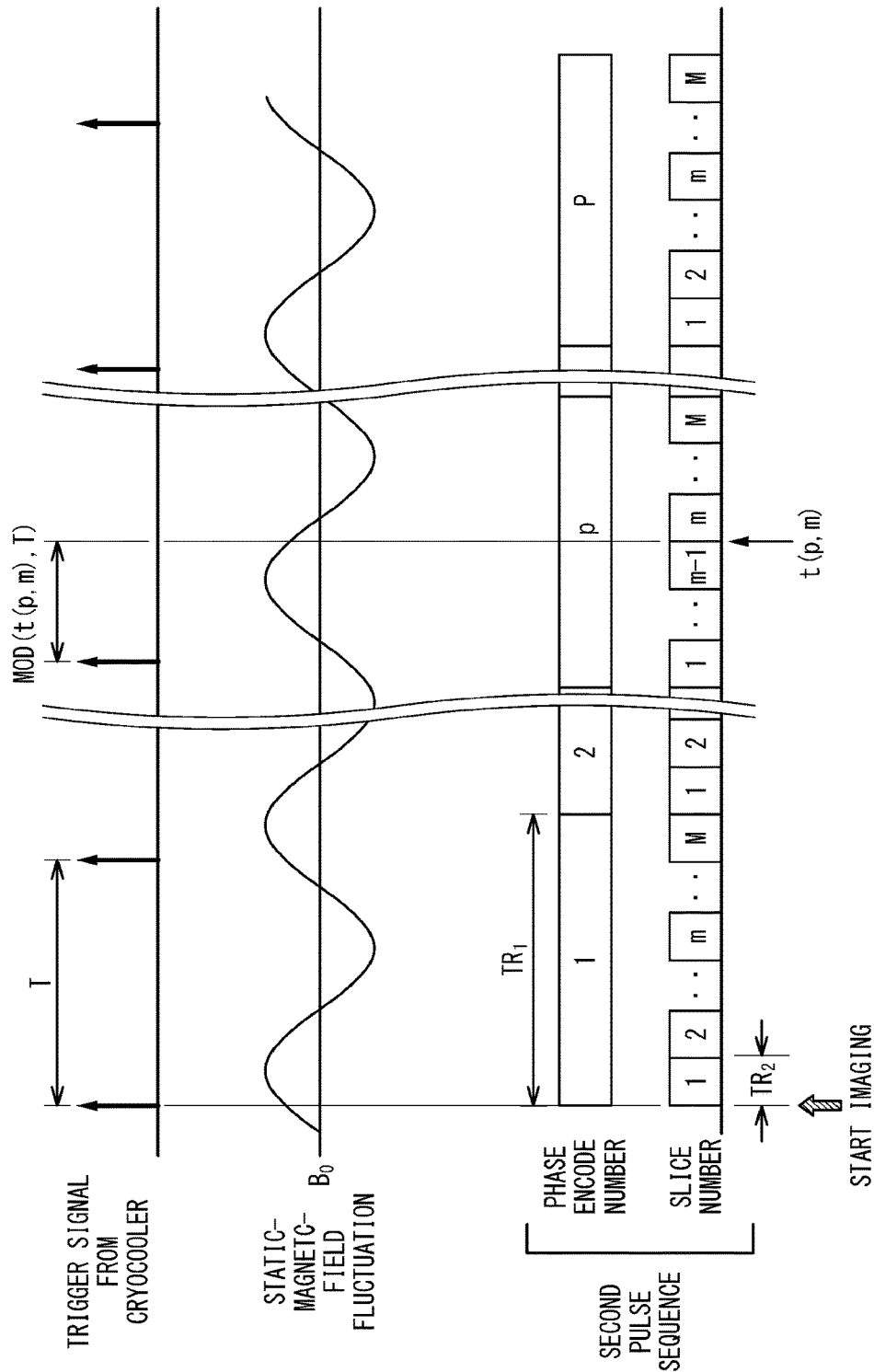
FIG. 8 is a schematic timing chart illustrating an example of processing in which the MR signals for generating a diagnostic image are acquired, in the first embodiment.

FIG. 8 is a schematic timing chart illustrating an example of processing in which the MR signals for generating a diagnostic image are acquired, using the second pulse sequence.

Figure 9:
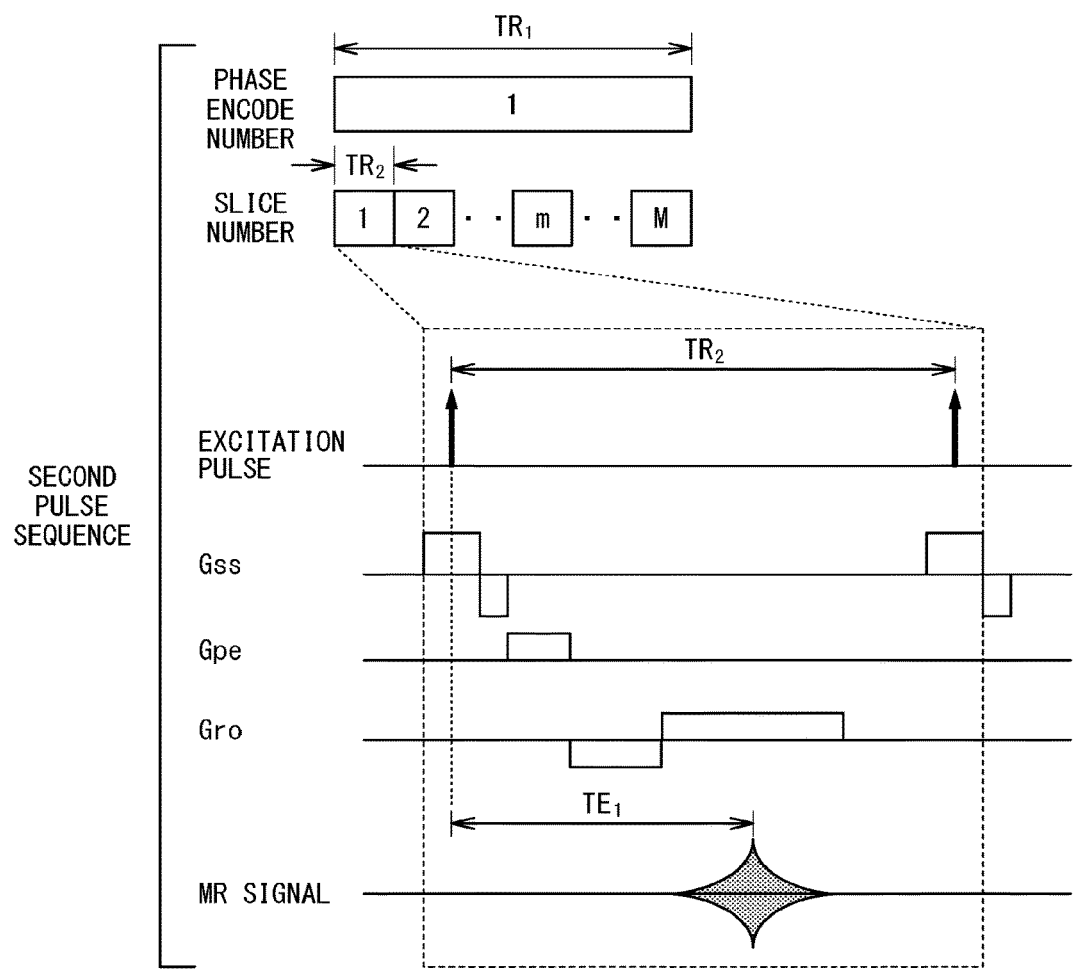
FIG. 9 is a schematic timing chart illustrating an example of a pulse sequence of acquiring the MR signals for generating a diagnostic image in the first embodiment.

FIG. 9 a schematic timing chart illustrating an example of the second pulse sequence.

The second pulse sequence is a pulse sequence of acquiring the MR signals for generating a diagnostic image, and is not limited to the type of the first pulse sequence. In other words, the type of the second pulse sequence may be different from the type of the first pulse sequence. For example, even if the first pulse sequence corresponds to a GRE method, the second pulse sequence may correspond to an SE method. In addition, even when both of the first and second pulse sequences use GRE method, the repetition time TR and the echo time TE of the second pulse sequence may be set to values different from those of the first pulse sequence.

As described above, since the GRE method is more susceptible to the influence of the static-magnetic-field fluctuation than the SE method, a pulse sequence according to the GRE method is used for the example of the second pulse sequence shown in each of FIG. 8 and FIG. 9.

The top part of FIG. 8 illustrates each trigger signal inputted from the cryocooler 110. The second top part of FIG. 8 illustrates the static-magnetic-field fluctuation. The lower half of FIG. 8 illustrates an example of the second pulse sequence. In the example of FIG. 8, data of M slice images are collectively acquired in one imaging sequence under a multi-slice method. In addition, the number of phase encode steps in each slice image is defined as P. Further, the slice number is defined as m (m=1 to M), and phase encode number is defined as p (p=1 to P). As the phase encode number p increases from one to P, phase encode amount increases from zero to the positive maximum value and the negative maximum value, for example. In addition, it is assumed that data of one phase encode are acquired from all of M slices in one repetition time $TR_1$ under the GRE type of pulse sequence, and the time required for acquiring data from each slice during each phase encode is defined as $TR_2$, as shown in the lower half of FIG. 8.

FIG. 9 illustrates an example of a detailed pulse sequence within the time $TR_2$ in which data of one phase encode of each slice are acquired. In the example of the second pulse sequence shown in FIG. 9, its sequence type corresponds to a GRE method similar to the first pulse sequence but the echo time $TE_1$ of the second pulse sequence is set to a value different from echo time $TE_0$ of the first pulse sequence shown in FIG. 5. In addition, as to time for acquiring one MR signal, the time $TR_2$ of the second pulse sequence is different from the time $TR_0$ of the first pulse sequence.

When a first trigger signal is inputted, the second pulse sequence is started in synchronization with the first trigger signal. Note that the second pulse sequence does not start immediately after the timing when a command for starting the imaging is outputted from the input device 43. At the timing when the first trigger signal is inputted from the cryocooler 110 after the above-described command for starting the imaging is outputted, the sequence controller 34 starts the second pulse sequence. Once the second pulse sequence is started, trigger signals inputted after the start of the second pulse sequence are ignored. Then, when all the MR signals for generating M slice images (i.e., P*M MR signals) are acquired, data acquisition is completed in the step ST203 of FIG. 7.

The MR signals acquired in the above manner are influenced by the static-magnetic-field fluctuation. Thus, the phase fluctuation caused by the static-magnetic-field fluctuation is included in the phase of each of the acquired MR signals. This phase fluctuation is corrected in the steps ST204 and ST205.

First, in the step ST204, processing of associating each of the acquired MR signals with the correction data stored in the memory circuitry 41 is performed so that the delay time with reference to the trigger signal from the cryocooler 110 is approximately equal between each MR signal and the correction data. Hereinafter, this associating will be described in detail.

When the start time point of data acquisition is defined as t=0, the time point t(p, m) of starting data acquisition of the p-th phase encode (1≤p≤P) line of the m-th slice (1≤m≤M) can be indicated by the following formula (5).

$$t(p,m)=TR1*(p-1)+TR2*(m-1) \quad \text{Formula (5)}$$

In addition, the delay time $T_{dT}$ from the trigger signal immediately before the time point t(p, m) to the time point t(p, m) is indicated by MOD(t(p, m), T). Here, MOD(A, B) means a remainder obtained by dividing A by B. The correction data having the same delay time as this delay time MOD(t(p, m), T), i.e., the number i (1≤i≤K) of the magnetic-resonance-frequency fluctuation $\Delta f_0(i)$ calculated by the formula (4) is determined by the following formula (6).

$$i=\text{INT}(\text{MOD}(t(p,m),T)/TR_0) \quad \text{Formula (6)}$$

In the formula (6), INT(C) indicates an integral number which is the closest to C.

Further, the magnetic-resonance-frequency fluctuation $\Delta f(p, m)$ at the time point t(p, m) is associated with the number i of the correction data determined by the formula (6), by using the following formula (7).

$$\Delta f(p,m)=\Delta f_0(i)=\Delta f_0(\text{INT}(\text{MOD}(t(p,m),T)/TR_0)) \quad \text{Formula (7)}$$

By the formula (7), the acquired MR signals can be associated with the correction data stored in the memory circuitry 41 such that the delay time with reference to the trigger signal from the cryocooler 110 is approximately equal between each MR signal and the correction data. It can be considered that both of the MR signals for generating a diagnostic image and the MR signals for generating the correction data are subjected to the same resonance-frequency fluctuation caused by the same static-magnetic-field fluctuation, when the delay time with reference to the trigger signal is common to both. Thus, the formula (7) is also an expression by which the magnetic-resonance-frequency fluctuation $\Delta f(p, m)$ at a time point t(p, m) is estimated to be equal to the correction data $\Delta f_0(\text{INT}(\text{MOD}(t(p, m), T)/TR_0))$ stored in the memory circuitry 41.

Next, in the step ST205, the phase of each of the MR signals associated with the correction data is corrected by using the correction data $\Delta f_0(i)$ (1≤i≤K) at each delay time. Specifically, this correction is performed as follows. When the echo time of the second pulse sequence is defined as $TE_1$, the phase of an MR signal at a time point t(p, m) for generating a diagnostic image is influenced by the phase fluctuation φ(p, m) indicated by the following formula (8).

$$\varphi(p,m) = (2\pi) * \Delta f(p,m) * TE_1 \qquad \text{Formula (8)}$$

The MR signal, which corresponds to the p-th phase encode and the m-th slice and has not been subjected to the phase correction processing, is defined as S(p, m). The MR signal, which corresponds to the p-th phase encode and the m-th slice and has been subjected to the phase correction processing, is defined as S'(p, m). In the step ST205, each of the acquired MR signals is corrected by the following formula (9).

$$S'(p,m) = S(p,m) * \exp[-j\varphi(p,m)] \qquad \text{Formula (9)}$$

In other words, the phase fluctuation φ(p, m) included in each MR signal caused by the mechanical fluctuation of the cryocooler 110 is eliminated by the correction processing with the use of the formula (9).

Finally, in the step S1206 of FIG. 7, a diagnostic image is generated by performing reconstruction processing such as two-dimensional inverse Fourier transform on the corrected MR signals. Since the phase fluctuation φ(p, m) is eliminated by the above-described correction processing, a diagnostic image in which artifact is suppressed can be generated.

Modification of First Embodiment

In the above-described first embodiment, imaging for acquiring a diagnostic image is started in synchronization with the trigger signal inputted from the cryocooler 110. In the example of FIG. 8, the second pulse sequence is started at the timing when the leftmost trigger signal in FIG. 8 is inputted. However, it is not necessarily required to start the second pulse sequence at the same time as the input timing of the first trigger signal. The second pulse sequence may be started at the timing when a predetermined delay time $T_D$ elapses from the input timing of the first trigger signal. When the delay time $T_D$ is known, the above-described first embodiment is practicable by substituting MOD((t(p, m)+$T_D$), T) for the delay time MOD(t(p, m), T) from the input timing of trigger signal even if the second pulse sequence is started after elapse of the predetermined delay time $T_D$ from the trigger signal.

Figure 10:
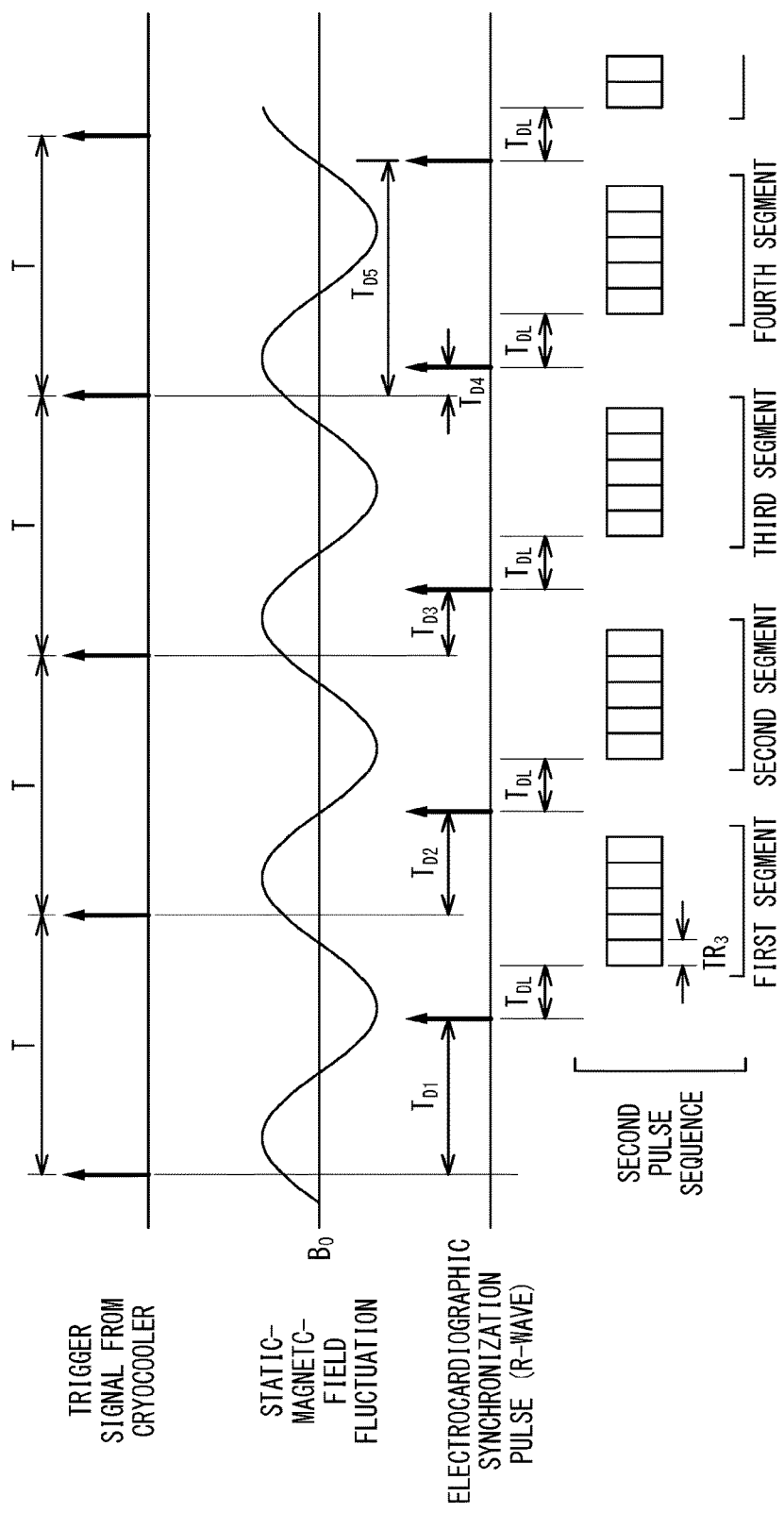
FIG. 10 is a schematic timing chart illustrating an example of an operation in a modification of the first embodiment.

The modification of the first embodiment shown in FIG. 10 is based on a further advanced idea as to the above-described start timing of the second pulse sequence. In an imaging field for generating a diagnostic image, an electrocardiographic synchronization method or a respiratory synchronization method are known, in which a pulse sequence is started in synchronization with a biological signal. In the example of FIG. 10, imaging of each segment is started at the timing delayed by the predetermined delay time $T_{DL}$ from an electrocardiographic synchronization pulse detected as an R-wave. Here, the "segment" means an acquisition data unit obtained by dividing a full k-space data in the phase encode direction by a predetermined segment number. When using an electrocardiographic synchronization method, each trigger signal from the cryocooler 110 is asynchronous with respect to an electrocardiographic synchronization pulse.

In such an imaging method, delay times $T_{D1}$, $T_{D2}$, $T_{D3}$, $T_{D4}$, and $T_{D5}$ between respective electrocardiographic synchronization pulses and respective trigger signals immediately before those electrocardiographic synchronization pulses can be measured. In addition, relationship between the acquired MR signals and each trigger signal can be determined, based on the measured delay times and the known delay time $T_{DL}$ from each electrocardiographic synchronization pulse. As a result, each of the acquired MR signals can be associated with the correction data, such that each delay time from the trigger signal becomes equal. Then, the phase fluctuation can be eliminated by performing the correction processing using the above correction data associated with the acquired MR signals.

As described above, even when imaging in synchronization with a trigger signal, such as an electrocardiographic synchronization pulse or a respiratory gate signal, and which is asynchronous with the trigger signal from the cryocooler 110, the phase fluctuation can be eliminated and image with suppressed artifact can be generated according to the modification of the first embodiment.

Second Embodiment

In the above-described first embodiment, the first pulse sequence for generating the correction data and the second pulse sequence for generating a diagnostic image are started based on the trigger signal from the cryocooler 110. By contrast, in the second embodiment, the MR signals for generating the correction data are acquired by the first pulse sequence without using the trigger signal from the cryocooler 110, and similarly, the MR signals for generating a diagnostic image are acquired by the second pulse sequence without using the trigger signal from the cryocooler 110.

In magnetic resonance imaging apparatuses, including the magnetic resonance imaging apparatus 1 of the present embodiment, a system clock having a constant period is generally used during which the apparatus is activated, and a pulse sequence is performed based on the system clock. Although the system clock is usually asynchronous with the trigger signal from the cryocooler 110, the period of the trigger signal from the cryocooler 110, (i.e., the period of the refrigeration cycle of the cryocooler 110) is constant and stable like the period of the system clock.

In the second embodiment, based on the fact that the period of the system clock and the period of the refrigeration cycle are both constant, temporal relationship between the system clock and the refrigeration cycle are associated with each other at least once. Then, after the association, the MR signals for generating the correction data and the MR signals for generating a diagnostic image are acquired in synchronization with the system clock.

Figure 11:
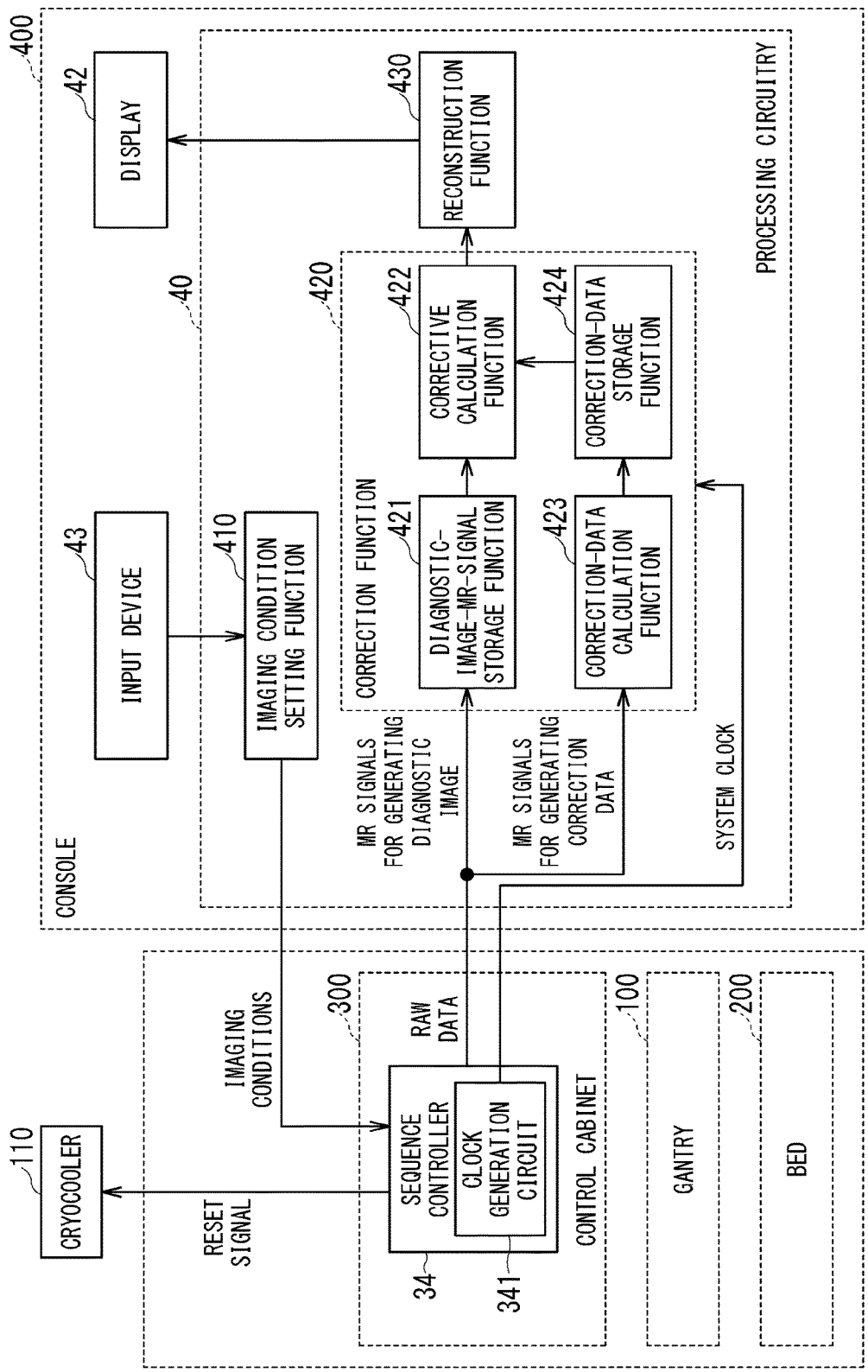
FIG. 11 is a block diagram illustrating an example of overall configuration of the magnetic resonance imaging apparatus in the second embodiment.

FIG. 11 is a block diagram illustrating an example of configuration of the magnetic resonance imaging apparatus 1 in the second embodiment. As is clear from FIG. 11, the magnetic resonance imaging apparatus 1 of the second embodiment further includes a clock generation circuit 341 configured to generate a system clock, having a constant and stable period. The clock generation circuit 341 is, for example, included in the sequence controller 34. The system clock operates from the timing of power activation of the magnetic resonance imaging apparatus 1. In addition, the clock generation circuit 341 includes a non-illustrated system clock counter which continues to count up the system clock after the power activation.

Further, in the second embodiment, a reset signal for resetting the refrigeration cycle is transmitted from the sequence controller 34 to the cryocooler 110.

Figure 12:
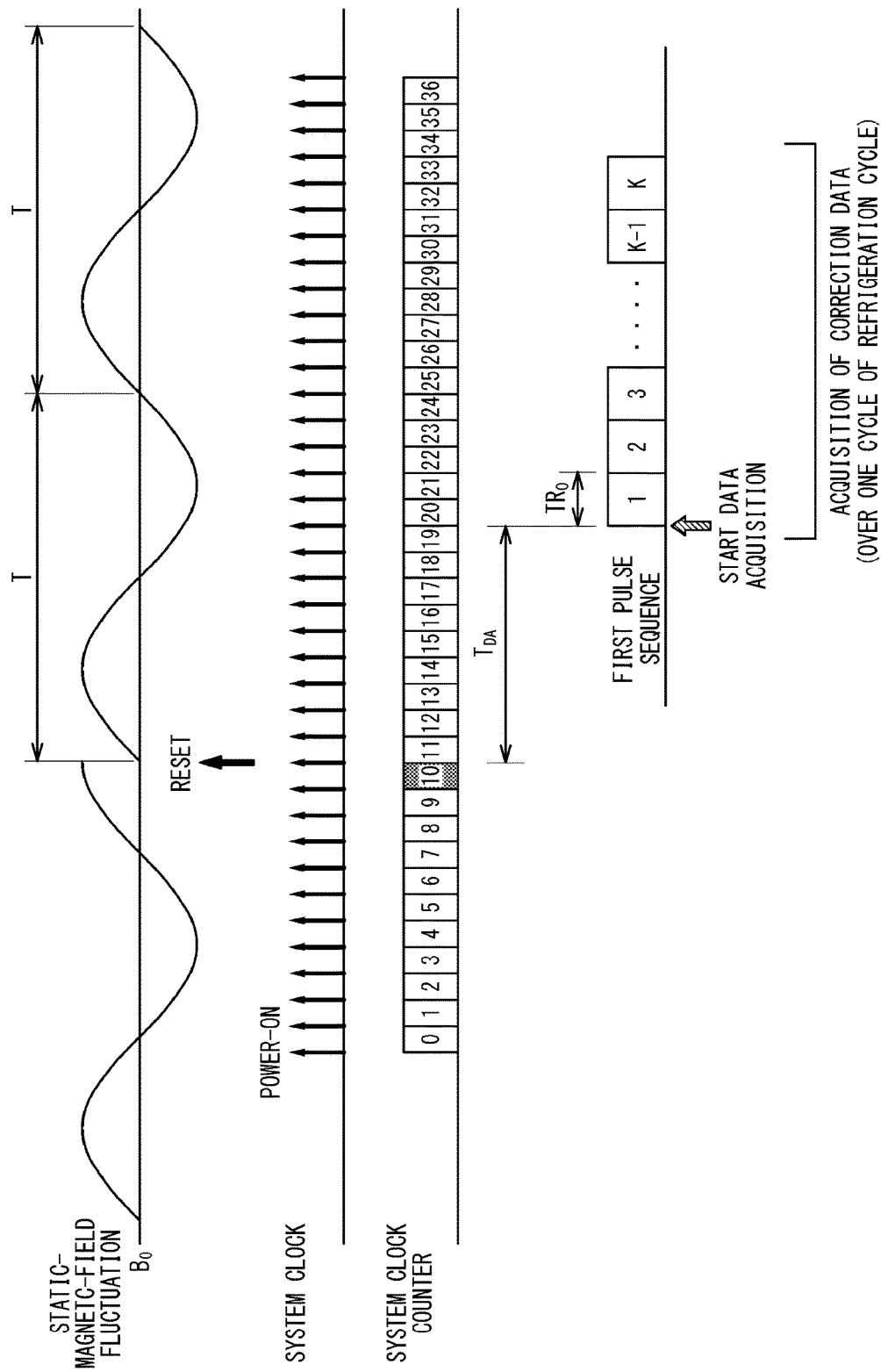
FIG. 12 is a schematic timing chart illustrating an example of processing in which the MR signals for generating the correction data are acquired, in the second embodiment.
Figure 13:
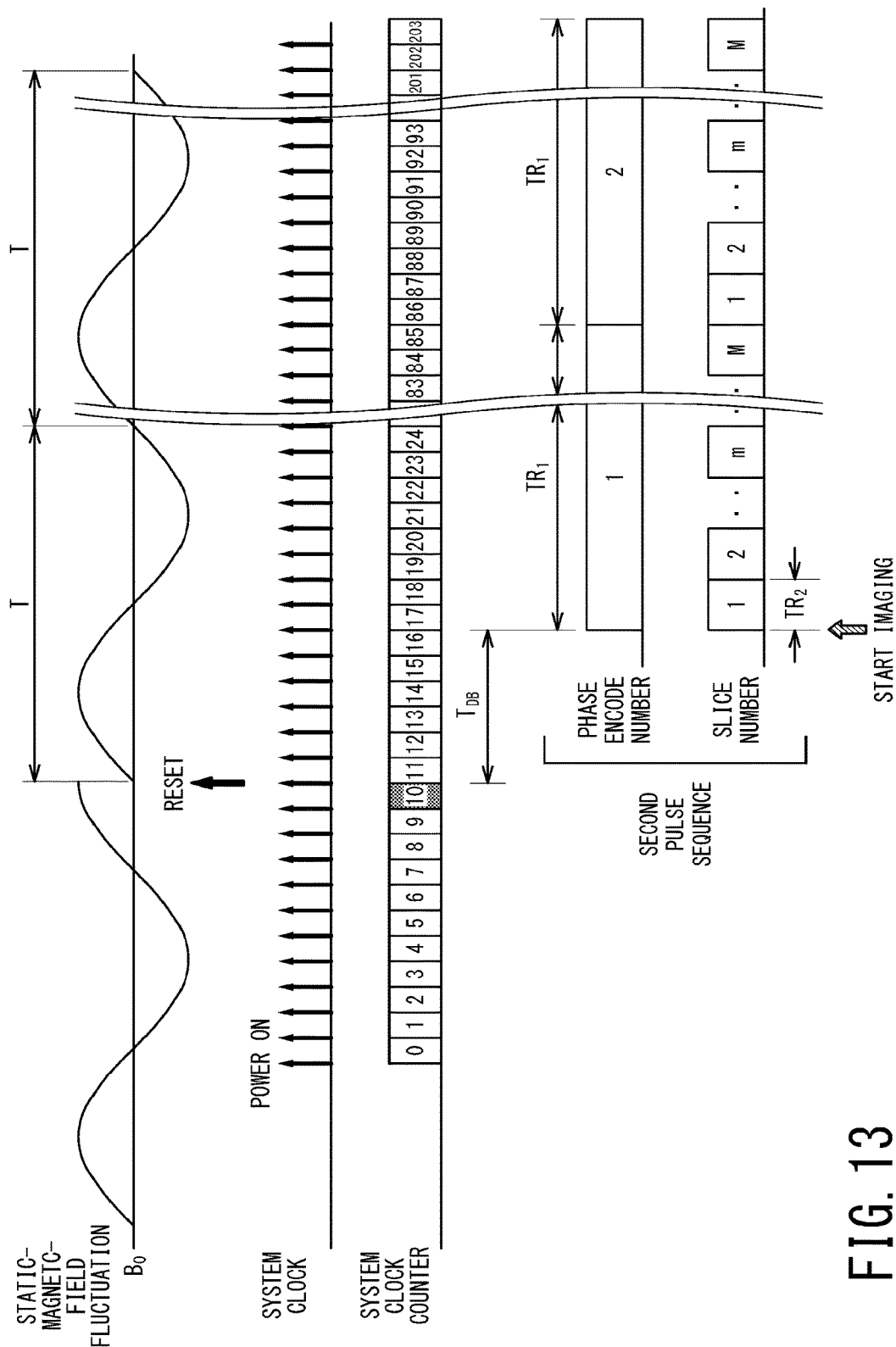
FIG. 13 is a schematic timing chart illustrating an example of processing in which the MR signals for generating a diagnostic image are acquired, in the second embodiment.

FIG. 12 and FIG. 13 are schematic timing charts illustrating examples of processing of acquiring MR signals in the second embodiment. FIG. 12 is a schematic timing chart illustrating an example of processing in which the MR signals for generating the correction data are acquired, in the second embodiment.

The top part of FIG. 12 indicates the static-magnetic-field fluctuation corresponding to the refrigeration cycle of the cryocooler 110.

The second top part of FIG. 12 indicates the system clock.

The third top part of FIG. 12 indicates an example of a count-up state of the system clock counter.

The lower half of FIG. 12 indicates an example of the first pulse sequence used for acquiring the MR signals for generating the correction data and is the same as that of the first embodiment described in FIG. 6.

When the magnetic resonance imaging apparatus 1 is activated, the system clock starts to operate, and at the same time, the system clock counter starts to count up. When the count value counted by the system clock counter reaches a predetermined count value (e.g., a count value ten in the case of FIG. 12), the sequence controller 34 outputs the reset signal to the cryocooler 110. The cryocooler 110 is configured to reset the refrigeration cycle so as to set a start timing of a new refrigeration cycle at the timing of receiving the reset signal.

A predetermined delay time $T_{DA}$ after resetting the cryocooler 110, the sequence controller 34 starts the first pulse sequence in synchronization with the system clock so as to acquire the MR signals for generating the correction data. This acquisition period is longer than the period T of the refrigeration cycle, similar to the first embodiment.

FIG. 13 is a schematic timing chart illustrating an example of processing in which the MR signals for generating a diagnostic image are acquired, in the second embodiment. Although acquisition of the MR signals for generating the correction data can be automatically performed during system start-up on a daily basis, such acquisition may be performed only at the time of installation work of the magnetic resonance imaging apparatus 1. In this case, power activation of the magnetic resonance imaging apparatus 1 at the time of acquiring the MR signals for generating the correction data is performed on a day different from the day when the MR signals for generating a diagnostic image are acquired. For this reason, in the example of FIG. 13, it is assumed that power activation of the magnetic resonance imaging apparatus 1 is performed again when the MR signals for generating a diagnostic image are acquired.

When the magnetic resonance imaging apparatus 1 is powered on, the system clock starts to operate, and at the same time, the system clock counter starts to count up the number of the elapsed cycles of the system clock. When the count value counted by the system clock counter reaches the count value ten as an example, the sequence controller 34 transmits the reset signal to the cryocooler 110. The operation so far is basically the same as the operation of acquiring the MR signals for generating the correction data.

A predetermined delay time $T_{DB}$ after resetting the cryocooler 110, the sequence controller 34 starts the second pulse sequence in synchronization with the system clock so as to acquire the MR signals for generating a diagnostic image.

The contents of the second pulse sequence in the second embodiment are the same as the first embodiment.

As long as the delay time $T_{DA}$ (See FIG. 12) from the reset timing to the start timing of the first pulse sequence and the delay time $T_{DB}$ from the reset timing to the start timing of the second pulse sequence are both known, both may be different from each other.

According to the above-described second embodiment, the phase of the refrigeration cycle can be associated, without ambiguity, with the count value of the system clock by the reset operation with respect to the cryocooler 110. In addition, since the delay times $T_{DA}$ and $T_{DB}$ from the reset timing are known, the MR signals for generating a diagnostic image can be associated with the MR signals for generating the correction data, without using the trigger signal from the cryocooler 110, so that the phase of the refrigeration cycle matches between both. The phase correction processing after the above association processing may be performed in a manner similar to the first embodiment.

According to the above-described second embodiment, the phase fluctuation caused by the mechanical fluctuation of the cryocooler 110 can be eliminated without using the trigger signal from the cryocooler 110 and a diagnostic image with suppressed artifact can be generated.

Third Embodiment

In the above-described first and second embodiments, acquisition of the MR signals for generating the correction data are assumed to be previously performed at the time of start-up of the magnetic resonance imaging apparatus 1 or during installation work of the magnetic resonance imaging apparatus 1, for example. By contrast, in the third embodiment, the MR signals for generating the correction data are acquired in a predetermined correction data acquisition span inserted in a period during which the MR signals for generating a diagnostic image are acquired.

Figure 14:
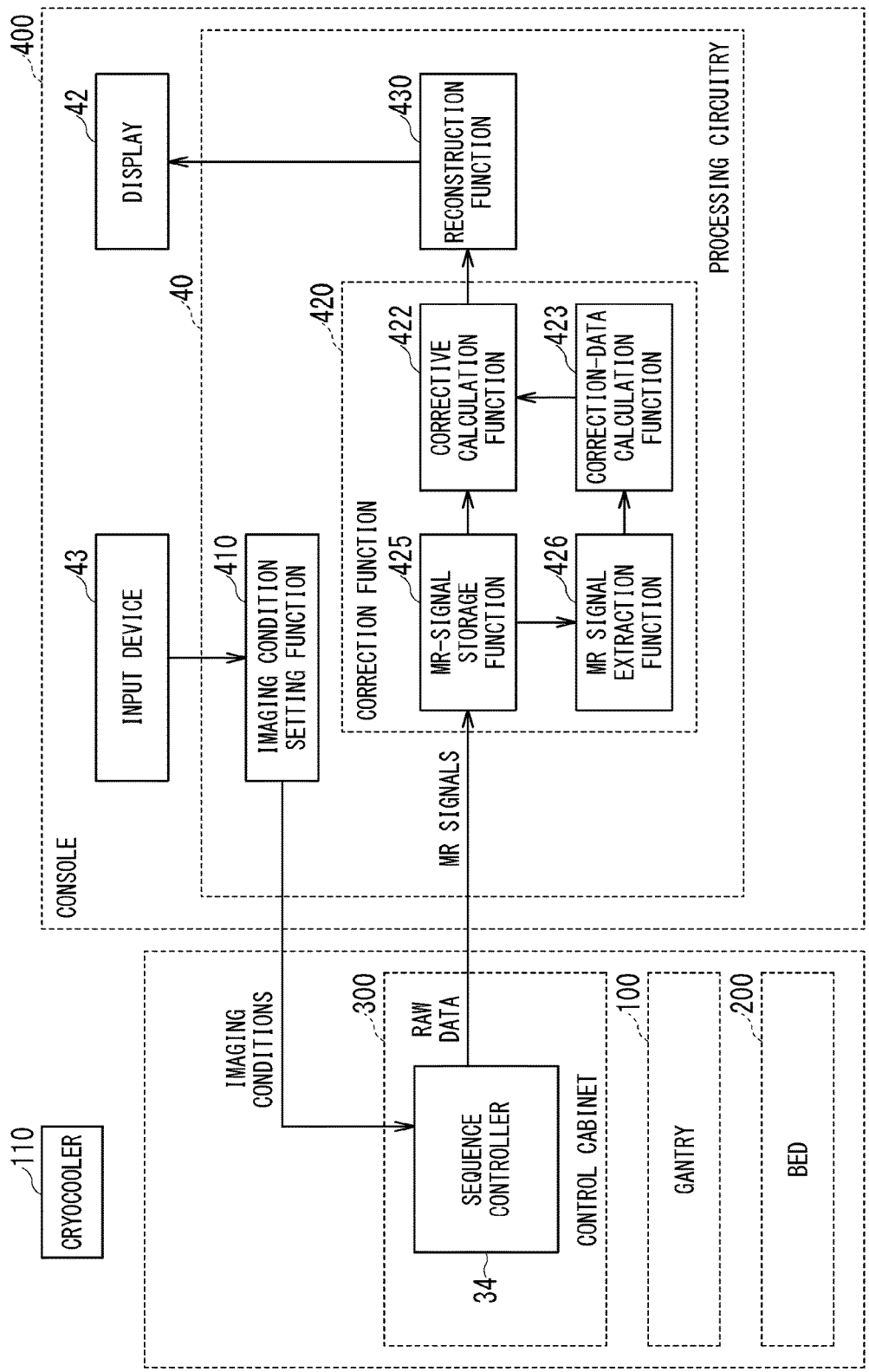
FIG. 14 is a block diagram illustrating an example of overall configuration of the magnetic resonance imaging apparatus in the third embodiment.

FIG. 14 is a block diagram illustrating an example of overall configuration of the magnetic resonance imaging apparatus 1 in the third embodiment. The correction function 420 of the third embodiment includes an MR-signal storage function 425 and an MR signal extraction function 426. The MR-signal storage function 425 is a function of storing the MR signals for generating a diagnostic image and the MR signals for generating the correction data. Other components except the MR-signal storage function 425 and the MR signal extraction function 426 are the same as the first and second embodiments.

Figure 15:
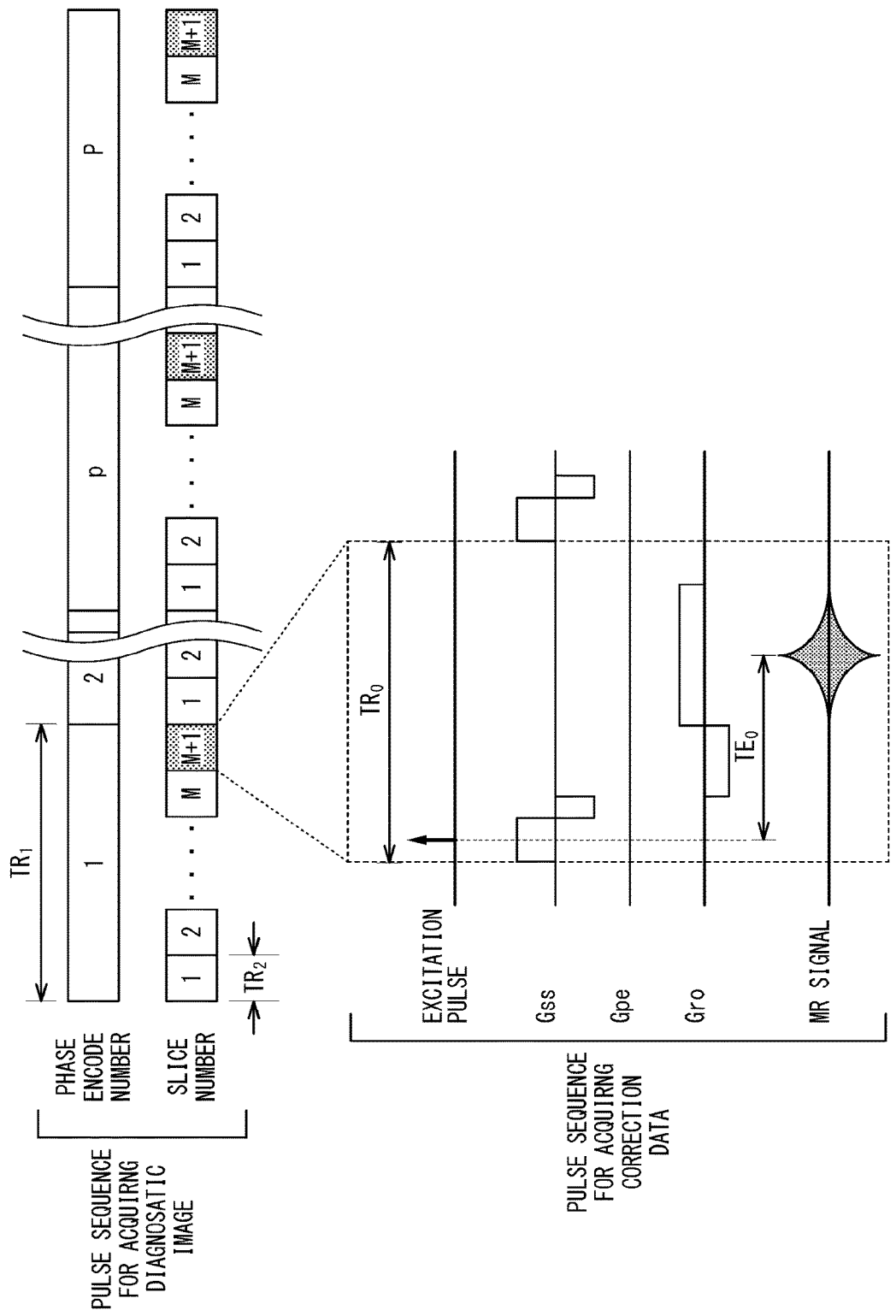
FIG. 15 is a schematic timing chart illustrating an example of an operation performed by the magnetic resonance imaging apparatus of the third embodiment.

FIG. 15 is a schematic timing chart illustrating an example of a pulse sequence performed by the magnetic resonance imaging apparatus 1 of the third embodiment. This pulse sequence runs in such a manner that M MR signals for generating M slices of diagnostic images and one MR signal for generating the correction data whose slice number is M+1 are acquired in an acquisition period of one phase encode (i.e., repetition time) TR. The MR signals for generating the correction data are acquired from, for example, a region adjacent to the slice whose slice number is M.

As shown in the lower part of FIG. 15, a pulse sequence of GRE type without applying a phase encode gradient is used for acquiring the MR signals for generating the correction data whose slice number is M+1, and is similar to that of the first embodiment (see FIG. 6). The pulse sequence used for acquiring each of the MR signals whose slice number is one to M may be different from the pulse sequence used for acquiring the MR signal whose slice number is M+1. Even if the pulse sequence used for acquiring each of the MR signals whose slice number is one to M and the pulse sequence used for acquiring the MR signal whose slice number is M+1 are both GRE type, the respective echo times of both pulse sequences may be different from each other.

The phase fluctuation $\varphi_{measure}(p)$ is calculated from the MR signals for generating the correction data acquired as the slice number M+1 in each phase encode number, in a manner similar to the formula (3).

$$\varphi_{measure}(p)=\tan^{-1}[\text{Img}(p)/\text{Real}(p)] \quad \text{Formula (10)}$$

In the formula (10), "p" is the phase encode number in the pulse sequence of acquiring the MR signals for generating diagnostic images. The magnetic-resonance-frequency fluctuation $\Delta f0_{measure}(p)$ at the echo time $TE_0$ can be calculated by substituting the above phase fluctuation $\varphi(p)_{measure}$ into the following formula (11).

$$\Delta f0_{measure}(p)=[\varphi_{measure}(p)/TE_0]/(2\pi) \quad \text{Formula (11)}$$

On the basis of this magnetic-resonance-frequency fluctuation $\Delta f0_{measure}(p)$, the phase fluctuation $\varphi_{image}(p)$ of each MR signal for generating a diagnostic image at the phase encode number p can be calculated by the following formula (12).

$$\varphi_{image}(p)=(2\pi)*\Delta f0_{measure}(p)*TE_3 \quad \text{Formula (12)}$$

In the formula (12), $TE_3$ is the echo time used for acquiring the MR signals for generating a diagnostic image and may be different from the echo time $TE_0$ used for acquiring the MR signals for generating the correction data.

Here, an MR signal for generating a diagnostic image at the phase encode number p before the phase correction is defined as S(p), and an MR signal S(p) after the phase correction (i.e., corrected MR signal) is defined as S'(p) Then, the corrected MR signal S'(p) can be calculated by the phase correction expressed by the following formula (13).

$$S'(p)=S(p)*\exp[-j\varphi_{image}(p)] \quad \text{Formula (13)}$$

A diagnostic image in which artifact is suppressed can be generated by performing reconstruction processing such as two-dimensional inverse Fourier transform on the corrected MR signals S'(p).

According to the third embodiment, the trigger signal from the cryocooler 110 is unnecessary for the phase correction processing, and the reset processing with respect to the cryocooler 110 is also unnecessary. Further, it is not required to previously acquire the MR signals for generating the correction data before acquiring the MR signals for generating a diagnostic image (i.e., before the main scan).

In each period of acquiring data of one phase encode (i.e., repetition time) $TR_1$ in the third embodiment, data acquisition of measuring the magnetic-resonance-frequency fluctuation $\Delta f0_{measure}(p)$ is performed once subsequent to data acquisition of M MR signals of respective M slices. However, the order of data acquisition is not limited to the above-described order. For example, in each period of acquiring data of one phase encode (i.e., repetition time) $TR_1$, data acquisition of measuring the magnetic-resonance-frequency fluctuation $\Delta f0_{measure}(p)$ may be performed before or in the middle of data acquisition of M MR signals of respective M slices. In any one of the above cases, it is assumed that the static-magnetic-field fluctuation in each period of acquiring data of one phase encode (i.e., repetition time) $TR_1$ is small enough to be ignored.

Further, data acquisition of measuring the magnetic-resonance-frequency fluctuation $\Delta f0_{measure}(p)$ is may performed plural times in each period of acquiring data of one phase encode (i.e., repetition time) $TR_1$.

For example, data acquisition of measuring the magnetic-resonance-frequency fluctuation $\Delta f0_{measure}(p)$ may be performed twice at the beginning part and ending part of each period of acquiring data of one phase encode (i.e., repetition time) $TR_1$. In this case, the magnetic-resonance-frequency fluctuation $\Delta f0_{measure}(p)$ at the acquisition timing of each of M MR signals for generating M slices acquired between the beginning part and ending part of the above period $TR_1$ can be calculated under the following assumption. That is, fluctuation velocity of the static magnetic field is assumed to be constant during each period of acquiring data of one phase encode (i.e., repetition time) $TR_1$, i.e., the static magnetic field is assumed to linearly change. Then, the magnetic-resonance-frequency fluctuation at the acquisition timing of each of M MR signals for generating M slices can be calculated by applying linear interpolation to the magnetic-resonance-frequency fluctuation, for example. The phase correction can be more precisely performed based on the above linear interpolation.

According to the magnetic resonance imaging apparatus 1 of each of the above-described embodiments, artifact caused by the mechanical fluctuation of the cryocooler 110 can be suppressed without further adding large-sized hardware such as a corrective magnetic field coil.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   a superconducting magnet configured to generate a static magnetic field;
   a cryocooler configured to cool down the superconducting magnet in a refrigeration cycle in which mechanical fluctuation with a predetermined period is included;
   a sequence controller configured to acquire first magnetic resonance (MR) signals for calculating correction data by executing a first pulse sequence, and acquire second MR signals from an object for generating a diagnostic image by executing a second pulse sequence after execution of the first pulse sequence; and
   processing circuitry configured to
   (a) calculate, as the correction data, first phase fluctuation or first frequency fluctuation included in the first MR signals, and
   (b) perform an arithmetic operation using the correction data on the second MR signals to correct second phase fluctuation or second frequency fluctuation included in the second MR signals,
   wherein the first and second phase fluctuations or the first and second frequency fluctuations are caused by periodic fluctuation of the static magnetic field caused by mechanical fluctuation of the cryocooler.

2. The magnetic resonance imaging apparatus according to claim 1, wherein
   the cryocooler is configured to output a trigger signal which is synchronized with a period of the mechanical fluctuation; and the sequence controller is configured to acquire the first MR signals and the second MR signals in synchronization with the trigger signal outputted from the cryocooler.

3. The magnetic resonance imaging apparatus according to claim 2,
wherein the sequence controller is configured to
(a) acquire the first MR signals in a period including at least one period of the mechanical fluctuation of the cryocooler in such a manner that a plurality of the correction data synchronized with the trigger signal are acquired, and
(b) acquire the second MR signals in synchronization with the trigger signal over a period longer than one cycle of the mechanical fluctuation of the cryocooler.

4. The magnetic resonance imaging apparatus according to claim 3,
wherein the processing circuitry is configured to
(a) associate the second MR signals and the correction data with each other in such a manner that each delay time from the trigger signal substantially becomes equal between the magnetic resonance signals for generating a diagnostic image and the correction data, and
(b) correct the second MR signals associated with the correction data, by using the correction data at each delay time from the trigger signal.

5. The magnetic resonance imaging apparatus according to claim 1, further comprising a clock generation circuit,
wherein the clock generation circuit is configured to output a system clock whose clock period is constant, while the magnetic resonance imaging apparatus is powered on; and
the sequence controller is configured to acquire the first and second MR signals in synchronization with the system clock, regardless of the trigger signal outputted from the cryocooler.

6. The magnetic resonance imaging apparatus according to claim 5,
wherein the sequence controller is configured to (a) acquire the first MR signals within a time including at least one period of the mechanical fluctuation of the cryocooler in such a manner that a plurality of the correction data synchronized with the system clock are acquired, and
(b) acquire the second MR signals in synchronization with the system clock over a time longer than one period of the mechanical fluctuation of the cryocooler.

7. The magnetic resonance imaging apparatus according to claim 6,
wherein the cryocooler is configured to set a start timing of the refrigeration cycle by being reset at least once at a predetermined timing of the system clock after startup of the magnetic resonance imaging apparatus; and
the processing circuitry is configured to
(a) associate phase of the refrigeration cycle with the system clock by resetting the cryocooler;
(b) associate the second MR signals with the correction data based on the system clock in such a manner that the phase of the refrigeration cycle substantially becomes equal between the magnetic resonance signals for generating a diagnostic image and the correction data, after resetting the cryocooler; and
(c) correct the second MR signals associated with the correction data, by using the correction data at each phase of the refrigeration cycle.

8. The magnetic resonance imaging apparatus according to claim 1,
wherein the sequence controller is configured to acquire the first MR signals by performing a first pulse sequence and acquire the second MR signals by performing a second pulse sequence; and
the processing circuitry is configured to set the first pulse sequence and the second pulse sequence in such a manner that a type of the first pulse sequence and a type of the second pulse sequence are different from each other.

9. The magnetic resonance imaging apparatus according to claim 8,
wherein the processing circuitry is configured to set the first pulse sequence in such a manner that phase encode amount of the first pulse sequence becomes zero.

10. The magnetic resonance imaging apparatus according to claim 1,
wherein the sequence controller is configured to acquire the first MR signals in a predetermined correction-data acquisition period which is inserted into a period of acquiring the magnetic resonance signals for generating a diagnostic image; and
the processing circuitry is configured to
(a) calculate, as the correction data, the magnetic-resonance-frequency fluctuation caused by periodic fluctuation of the static magnetic field or the phase fluctuation by using the magnetic resonance signals for generating the correction data, and
(b) correct the second MR signals by using the correction data.

11. The magnetic resonance imaging apparatus according to claim 8,
wherein the sequence controller is configured to
(a) insert a plurality of correction-data acquisition periods into a period of acquiring the magnetic resonance signals for generating a diagnostic image, and
(b) set a time interval between respective correction-data acquisition periods to a value shorter than a period of the refrigeration cycle.

12. An artifact suppression method of a magnetic resonance imaging apparatus equipped with a superconducting magnet configured to generate a static magnetic field and a cryocooler configured to cool down the superconducting magnet in a refrigeration cycle in which mechanical fluctuation with a predetermined period is included, the artifact suppression method comprising:
acquiring first magnetic resonance (MR) signals for calculating correction data by executing a first pulse sequence, and acquiring second MR signals from an object for generating a diagnostic image by executing a second pulse sequence after execution of the first pulse sequence;
calculating, as the correction data, first phase fluctuation or first frequency fluctuation included in the first MR signals, and
performing an arithmetic operation using the correction data on the second MR signals to correct second phase fluctuation or second frequency fluctuation included in the second MR signals to correct second phase fluctuation or second frequency fluctuation included in the second MR signals,
wherein the first and second phase fluctuations or the first and second frequency fluctuations are caused by periodic fluctuation of the static magnetic field caused by mechanical fluctuation of the cryocooler.

13. The artifact suppression method of a magnetic resonance imaging apparatus according to claim 12, further comprising:

acquiring the first MR signals in a predetermined correction-data acquisition period inserted into a period of acquiring the second MR signals; and calculating, as correction data, the magnetic-resonance-frequency fluctuation caused by periodic fluctuation of the static magnetic field or the phase fluctuation by using the first MR signals, wherein correction of the phase fluctuation included in the second MR signals is performed by using the correction data.

* * * * *